United States Patent [19]

Kobayashi et al.

[11] Patent Number: 5,485,421
[45] Date of Patent: Jan. 16, 1996

[54] NON-VOLATILE SEMICONDUCTOR MEMORY DEVICE INCORPORATING DATA LATCH AND ADDRESS COUNTER FOR PAGE MODE PROGRAMMING

[75] Inventors: Shinichi Kobayashi; Takeshi Nakayama; Yoshikazu Miyawaki; Tomoshi Futatsuya; Yasushi Terada, all of Hyogo, Japan

[73] Assignee: Mitsubishi Denki Kabushiki Kaisha, Tokyo, Japan

[21] Appl. No.: 295,582

[22] Filed: Aug. 25, 1994

Related U.S. Application Data

[62] Division of Ser. No. 826,943, Jan. 28, 1992, Pat. No. 5,363,330.

[30] Foreign Application Priority Data

Jan. 28, 1991 [JP] Japan ........................... 3-29404
Oct. 25, 1991 [JP] Japan ........................... 3-280012

[51] Int. Cl.⁶ ................................................. G11C 16/02
[52] U.S. Cl. ........................ 365/189.05; 365/189.05; 365/238.5; 365/236

[58] Field of Search ............................ 365/185, 189.05, 365/238.5, 900, 236

[56] References Cited

U.S. PATENT DOCUMENTS

| | | | |
|---|---|---|---|
| 4,805,151 | 2/1989 | Terada et al. | 365/189.07 |
| 4,891,791 | 1/1990 | Iijima | 365/189.01 |
| 4,953,129 | 8/1990 | Kobayashi et al. | 365/203 |
| 5,134,583 | 7/1992 | Matsuo et al. | 365/200 |
| 5,136,546 | 8/1992 | Fukuda et al. | 365/230.03 |

*Primary Examiner*—David C. Nelms
*Assistant Examiner*—Andrew Q. Tran
*Attorney, Agent, or Firm*—Lowe, Price, Leblanc & Becker

[57] ABSTRACT

A column latch and a high voltage switch connected to each bit line are eliminated, and an address counter and the data latch are newly provided. The data latch is arranged between an I/O buffer and a Y gate. In a programming cycle, the address counter is activated and transfer gates in the Y gate are successively selected. Consequently, a high voltage Vpp or 0 V is applied periodically to bit lines in the memory cell array in accordance with the write data stored in the data latch.

11 Claims, 21 Drawing Sheets

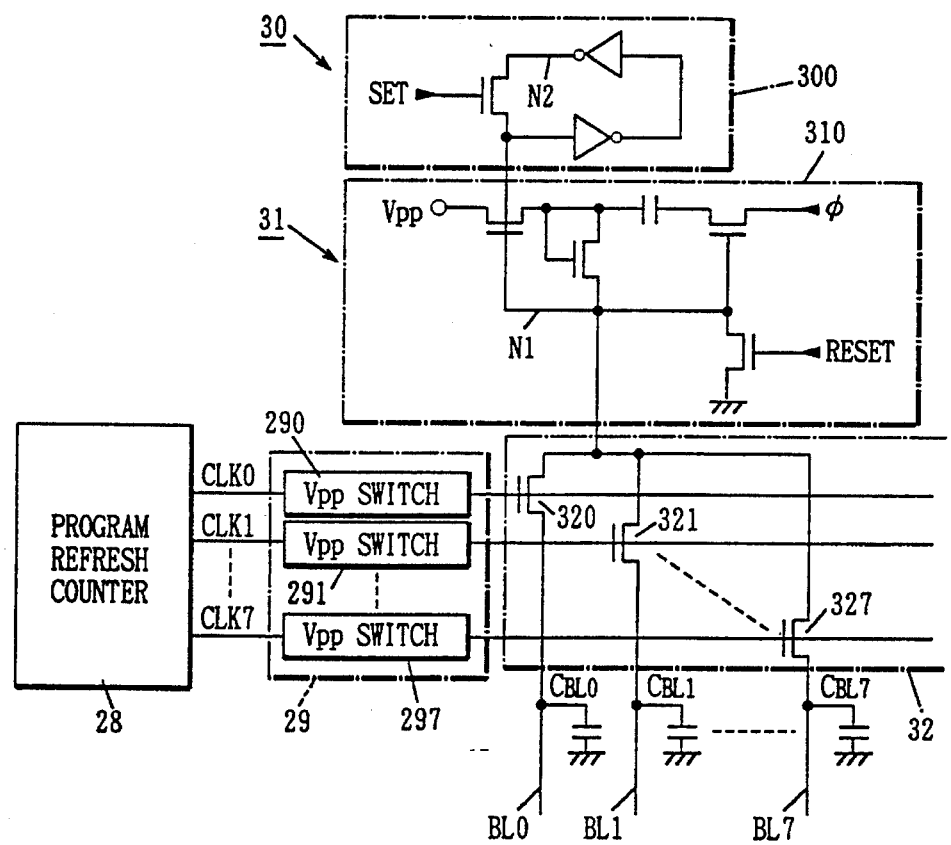

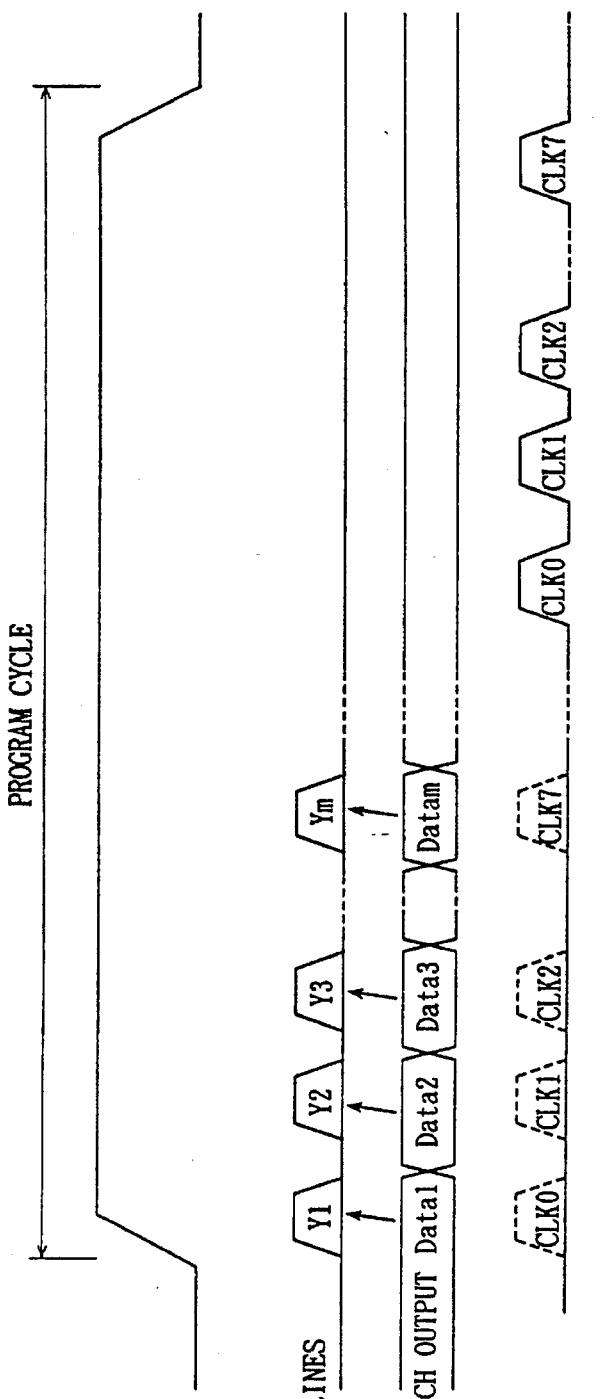

Fig. 12A (ERASE CYCLE)  WL1
Fig. 12B (ERASE CYCLE)  Erase
Fig. 12C (ERASE CYCLE)  CG1

ACLK0~7 = 0V
BCLK0~7 = 0V
Y1~m = 0V
WL2~n = 0V

| ERASE | CG=Vpp | BL=0V | WL="H" | SL=0V or HighZ |
| PROGRAM | CG=0V | BL=Vpp | WL=Vpp | SL=HighZ |

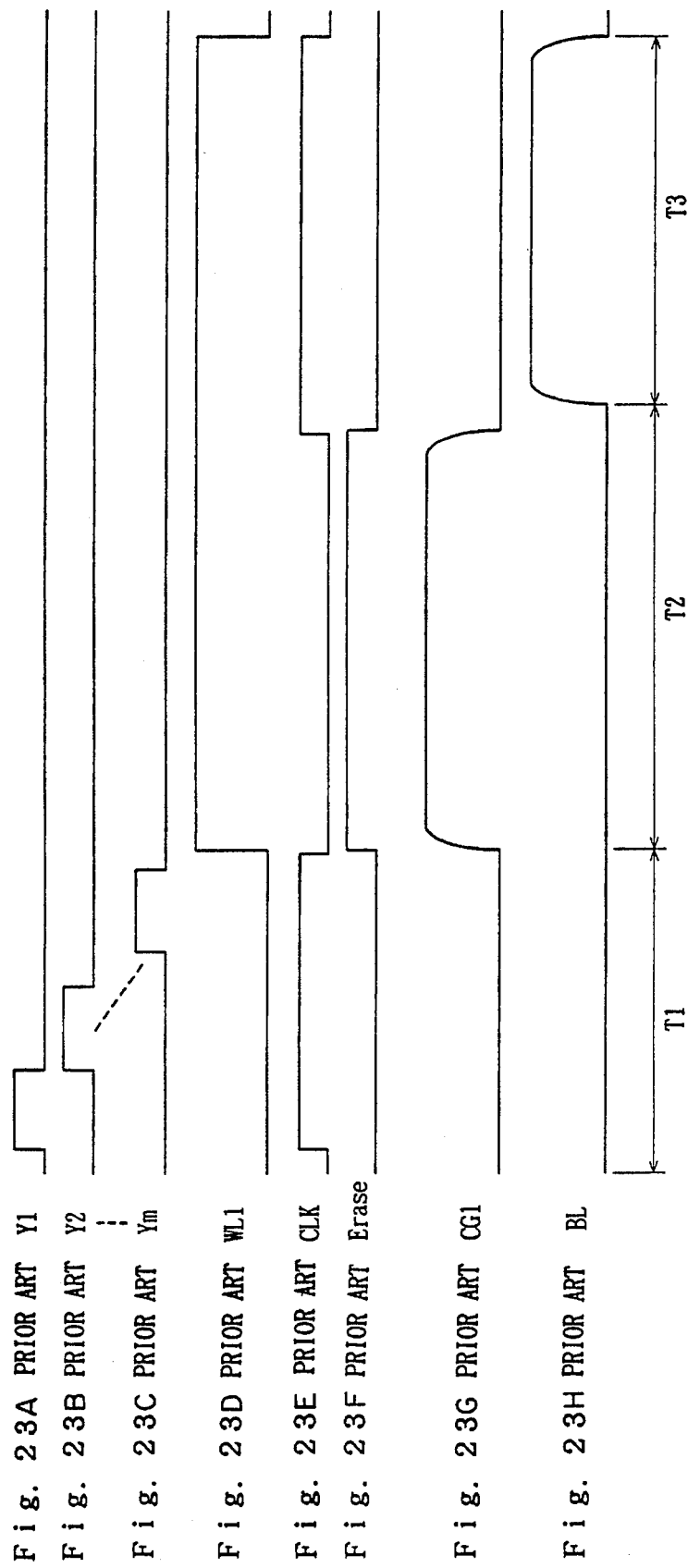

NON-VOLATILE SEMICONDUCTOR MEMORY DEVICE INCORPORATING DATA LATCH AND ADDRESS COUNTER FOR PAGE MODE PROGRAMMING

This application is a division of application Ser. No. 07/826,943 filed Jan. 28, 1992, U.S. Pat. No. 5,363,338.

BACKGROUND OF THE INVENTION

1. Field of the Invention

The present invention relates to a semiconductor memory device and, more specifically, to an electrically programmable and erasable non-volatile semiconductor memory device in which a plurality of bytes can be programmed/erased at one time, and to a method of operating the same.

2. Description of the Background Art

FIG. 19 is a cross sectional view of a general electrically programmable/erasable non-volatile semiconductor memory device (hereinafter referred to as an EEPROM).

Referring to FIG. 19, the memory cell structure of the EEPROM will be briefly described. $N^+$ impurity regions 2, 3 and 10 are formed spaced apart by a prescribed distance on a main surface of a $P^-$ semiconductor substrate 1. A gate electrode 4 is formed on a region between impurity regions 2 and 3 with an insulating film formed of oxide interposed. A floating gate 7 electrically insulated by a very thin oxide film (tunnelling oxide film) 6 of about 100Å is formed on impurity region 3, and a control gate 8 with interposed insulating film is formed thereon. Thus, a memory transistor (two-layered gate transistor) 9 having a two-layered gate structure is provided.

In the EEPROM, 1 bit of memory cell is formed by a selecting transistor and a memory transistor 9. Impurity region 2 is connected to a bit terminal BL, a gate electrode 4 is connected to a word terminal WL, and impurity region 10 is connected to a source terminal SL. Control gate 8 is connected to a control gate terminal CG.

In an actual memory cell array, gate electrode 4 is connected to a word line for selection in the row direction of the memory cell array, and impurity region 2 is connected to a bit line for selection in the column direction. Impurity region 10 is connected to a source line.

The operation of the memory cell shown in FIG. 19 will be described.

A high voltage Vpp (generally, about 12 V) is applied to the bit terminal BL and word terminal WL of the memory cell, 0 V is applied to the control gate terminal CG and the source terminal SL is set to a high impedance state. Then, a very strong electric field is applied from floating gate 7 to the oxide film 6 in the direction of impurity region 3, and electrons are drawn from floating gate 7 to impurity region 3 because of tunneling phenomenon. Consequently, the potential of floating gate 7 attains positive, and two-layered gate transistor 9 turns on even if 0 V is applied to control gate 8. More specifically, two-layered gate transistor 9 is set to a depression state. This state is called a programmed state which corresponds to data "0".

A high voltage Vpp (generally, 12 V) is applied to control gate terminal CG of the memory cell, 0 V is applied to the bit terminal BL and a high level signal is applied to the word terminal WL. The source terminal SL is applied with 0 V or it is set to a high impedance state. Then a very strong electric field is applied to oxide film 6 from impurity region 3 in the direction of floating gate 7, and electrons are introduced from impurity region 3 to floating gate 7 because of tunneling phenomenon. Consequently, the potential of floating gate 7 attains negative, and two-layered gate transistor 9 does not turn on when 0 V is applied to control gate 8. Namely, two-layered gate transistors 9 is set to an enhancement state. This state is called an erased state, which corresponds to data "1".

The above described erasing and programming operations of the memory cell are collectively defined as writing.

In order to read information (data) written in the memory cell, the potential of the word terminal WL is set to a high level, and 0 V is generally applied to the control gate terminal CG, and whether or not a current flows between the bit terminal BL and source terminal SL is detected.

FIG. 20 shows relation between a current ICE11 flowing between the bit terminal BL and the source terminal SL and the voltage VCG applied to the control gate terminal CG at the programmed state and the erased state. If VCG=0 V and the current flows, it means that the memory cell is at the programmed state, and if the current does not flow, it can be determined that the memory cell is at the erased state.

FIG. 21 is a block diagram showing a chip structure of a general EEPROM, and FIG. 22 is a schematic diagram showing specific circuit structure of the memory cell array and the periphery.

Referring to FIG. 21, a memory cell array 11 includes a plurality of memory cells arranged in a matrix. A plurality of word lines are arranged corresponding to a plurality of rows of the memory cell. A plurality of bit lines are arranged corresponding to a plurality of columns of the memory cells. Address signals for selecting addresses in memory cell array 11 are input through address terminals A0 to Ak to a X address buffer 12 and a Y address buffer 13. A X decoder 14 receives an output signal from X address buffer 12 and selects one word line from the plurality of word lines. A Y decoder 15 receives an output signal from Y address buffer 13 and selects a bit line corresponding to 1 data from the plurality of bit lines.

A Y gate 18 receives an output signal from Y decoder 15, and connects the selected bit line to a write driver 16 and to a sense amplifier 17. An I/O buffer 19 inputs an input data applied from data input/output terminals D0 to D7 to write driver 16, or outputs output data applied from sense amplifier 17 to data input/output terminals D0 to D7. Write driver 16 transmits the input data to the bit line in memory cell array 11 through Y gate 18, and further writes the data to a column latch group 20 through a transfer gate group 21. Sense amplifier 17 detects whether or not the selected memory cell is at the programmed state or at the erased state.

A Vpp switch group 22 applies a high voltage to the bit line in memory cell array 11 in accordance with the data latched in column latch group 20. A charge pump 23 generates a high voltage from an external power supply which is necessary at writing. An erasure/program timing control circuit 24 controls timing of the erasing and programming operations.

An output enable terminal $\overline{OE}$ receives an output enable signal designating whether it is an output enabled state or not; a chip enable terminal $\overline{CE}$ receives a chip enable signal designating whether or not it is a chip active state or not; and a write enable terminal $\overline{WE}$ receives a write enable signal designating whether it is a write enable state or not. A write/read control circuit controls chip mode in response to the output enable signal, the chip enable signal and the write enable signal.

The circuit structure of the memory cell array 11 and the periphery thereof will be described in detail with reference to FIG. 22.

In memory cell array 11, a plurality of word lines WL1 to WLn are arranged corresponding to a plurality of rows of memory cells, and a plurality of bit lines are arranged corresponding to a plurality of columns of memory cells. A plurality of control gates CG1 to CGn are arranged corresponding to the plurality of rows of the memory cells. The plurality of bit lines are classified into bytes 1 to m each including 8 bit lines BL0 to BL7. All the memory cells (memory cells of the bytes 1 to m) connected to one word line are called a page.

Column latch group 20 includes a plurality of column latches 200, transfer gate group 21 includes a plurality of transfer gate 210, and Vpp switch group 22 includes a plurality Vpp switches 220.

In order to enable collective erasure/programming page by page, one column latch 200 and one Vpp switch 220 are connected to each bit line. A Vpp switch 230 for applying a high voltage to control gates CG1 to CGn is connected to a control gate activating line CGA. The control gate activating line CGA is arranged parallel to bit lines BL0 to BL7. Y decoder 15 is connected to m Y gate lines Y1 to Ym corresponding to the bytes 1 to m. Y gate 18 includes m sets of transfer gates G1 to Gm corresponding to bytes 1 to m. Y gate lines Y1 to Ym are respectively connected to transfer gates G1 to Gm.

A series of erasing/programming operation of the EEPROM shown in FIGS. 21 and 22 will be described with reference to the timing chart of FIG. 23.

In FIG. 23, the reference character T1 shows a write cycle for writing externally input write data to a prescribed column latch 200, T2 shows an erasing cycle for setting all memory cells of the page selected by the word line to the erased state, and T3 shows a program cycle for collectively programming the memory cells of the page selected by the word line in accordance with the write data latched in column latch 200.

(1) Write Cycle

First, Y gate lines Y1 to Ym are successively selected by Y decoder 15. Y gates Y1 to Ym correspond to bytes 1 to m, respectively. Write data are written by write driver 16 to the column latch 200 of the selected byte. Consequently, write data of all memory cells connected to one word line (memory cells of one page) are latched in column latch 200.

(2) Erasing Cycle

Before entering the program cycle, the memory cells of selected page are erased. Now, assume that memory cells connected to word line WL1 (memory cells of the page 1) are to be rewritten.

At first, all memory cells of page 1 are erased. When an erasing signal Erase shown in FIG. 22 attains "H", Vpp switch 230 is activated. Potential of word line WL1 rises to high voltage Vpp. Consequently, high voltage Vpp is applied to the control gates CG1 of all the memory cells of page 1 through a transistor S10, and thus all memory cells of page 1 are erased.

(3) Program Cycle

At the end of the erasing cycle, Vpp switches 220 connected to bit lines BL0 to BL7 are activated in accordance with the write data latched in column latch 200. At this time, the potential of word line WL1 has already risen to high voltage Vpp. Accordingly, high voltage Vpp or 0 V is applied to tunneling region of memory transistors M0 to M7 through selecting transistors S0 to S7, and memory cells in page 1 are programmed at one time.

At this time, if write data is "0", the bit line corresponding to the column latch 200 attains the high voltage Vpp, and if write data is "1", the bit line corresponding to the column latch remains at 0 V. The above described method of writing is generally called page mode writing.

The conventional EEPROM is structured as described above, and a Vpp switch and a column switch are provided for each bit line for allowing collective writing page by page. In the generation where the area of the memory itself is large, the Vpp switches can be laid out relatively easily. However, as the degree of integration of the memory becomes higher, it becomes difficult to lay out Vpp switches in accordance with the pitches of the memory cells. In addition, the column switches must also be laid out accordant with the memory cells. Therefore, layout of the column switches as well as the Vpp switches is difficult.

SUMMARY OF THE INVENTION

An object of the present invention is to provide an EEPROM suitable for higher degree of integration in which layout can be easily done while providing function of page mode writing.

Another object of the present invention is to reduce the number of high voltage switches and/or column latches in an EEPROM.

A further object of the present invention is to provide a method of operating an EEPROM enabling easier layout while providing the function of page mode writing.

A non-volatile semiconductor memory device capable of electrically programming and erasing a plurality of bytes at one time in accordance with the present invention includes a plurality of bit lines; a plurality of memory cells connected to the plurality of bit lines; an input buffer for inputting externally applied write data; a data holding circuit for holding the write data input from the input buffer; a reading circuit for periodically and repetitively reading each of the write data held in the data holding circuit during programming; a write voltage generating means for generating a write voltage in accordance with the write data read from the reading circuit; and a selecting circuit. The selecting circuit repetitively and periodically selects each of the plurality of bit lines during programing, and connects the selected bit line to the write voltage generating circuit.

The selecting circuit may include a plurality of transfer gates respectively connected between each of the plurality of bit lines and the write voltage generating circuit, and a counter for repetitively and periodically selecting and turning on each of the plurality of transfer gates during programming.

In the non-volatile semiconductor memory device, each of the plurality of bit lines is periodically and repetitively selected during programming, and write voltage is applied in accordance with the write data held in the data holding means to the selected bit line. Therefore, the write voltage can be supplied to each bit line for a time period sufficient for writing to the memory cells.

In the non-volatile semiconductor memory device, it is not necessary to provide the high voltage switch and the column latch for each bit line. The data holding circuit corresponding to the column latch can be arranged between the input buffer and the bit line. Therefore, difficulty in the pattern layout of the high voltage switches and the column latches can be eliminated, providing margin in the layout of elements. In this manner, data holding means corresponding to the column latch can be laid out with margin. This makes easier the pattern layout, and a non-volatile semiconductor memory device suitable for higher degree of integration having page mode writing function can be provided.

A non-volatile semiconductor memory device in accordance with another aspect of the present invention includes a plurality of bit lines; a plurality of memory cells connected to the plurality of bit lines; a write data supplying circuit for supplying write data to each of the plurality of bit lines; a plurality of sets of write voltage establishing circuits; and a selecting circuit. Each of the plurality of write voltage establishing circuits includes a high voltage switch and a latch, and it establishes a write voltage in accordance with the write data. Each of the plurality of sets of write data establishing circuits is commonly provided for a prescribed plurality of bit lines. The selecting circuit periodically and repetitively selects each of the plurality of bit lines during programming, and connects the selected bit line to the corresponding write voltage establishing circuit.

The selecting circuit may include a plurality of transfer gates respactively connected between each of the plurality of bit lines and the corresponding one of the write voltage establishing circuit, and a counter for periodically and repetitively selecting and turning on each of the plurality of transfer gates during programming.

In the non-volatile semiconductor memory device, each of the plurality of bit lines are periodically and repetitively selected during programming, and the selected bit line is connected to the corresponding one of the write voltage establishing circuits. The write voltage establishing circuit establishes the write voltage in accordance with the write data applied to the selected bit line. Therefore, the write voltage can be supplied for a time sufficient for writing to the memory cell to each bit line.

In the non-volatile semiconductor memory device, each write voltage establishing circuit is commonly provided for a prescribed plurality of bit lines, and therefore the number of high voltage switches and of the latches can be significantly reduced. Therefore, difficulty in pattern layout of the high voltage switches and the latches can be eliminated, providing margin in laying out the elements. Therefore, pattern layout becomes easier, and a nonvolatile semiconductor memory device suitable for higher degree of integration having page mode writing function can be provided.

A non-volatile semiconductor memory device in accordance with a further aspect of the present invention includes a plurality of bit lines; a plurality of memory cells connected to the plurality of bit lines; a plurality of latches for holding write data; a plurality of high voltage switches; and a selecting circuit.

A plurality of latches are provided corresponding to the plurality of bit lines; each of the plurality of high voltage switches is commonly provided for a prescribed plurality of bit lines. Each high voltage switch and the corresponding prescribed plurality of latches constitute a write voltage establishing circuit for establishing the write voltage in accordance with the write data. The selecting circuit periodically and repetitively selects each of the plurality of bit lines and the corresponding latches during programming, and connects the selected bit line to the corresponding high voltage switch and to the selected latch.

The selecting circuit may include a plurality of nodes respectively connected to the plurality of high voltage switches; a plurality of first transfer gates each connected between each of the plurality of bit lines and the corresponding one of the nodes; a plurality of second transfer gates each connected between each of the plurality of latches and the corresponding one of the nodes; and a counter for periodically and repetitively selecting and turning on each of the plurality of first transfer gates and each of the plurality of second transfer gates during programming.

In the non-volatile semiconductor memory device, each of the plurality of bit lines and the corresponding latches are periodically and repetitively selected during programming, and the selected bit line is connected to the corresponding high voltage switch and the selected latch. Each high voltage switch establishes the write voltage to the selected bit line in accordance with the write data held in the selected latch. Therefore, the write voltage can be supplied to each bit line for a time sufficient for writing to the memory cells.

In the non-volatile semiconductor memory device, each high voltage switch is commonly provided for a prescribed plurality of bit lines, and therefore the number of high voltage switches can be significantly reduced. In addition, a plurality of latches can be arranged in the same direction as the bit lines. Therefore, the difficulty in pattern layout of the high voltage switches and the latches can be eliminated, providing margin in laying out elements. Therefore, a non-volatile semiconductor memory device suitable for higher degree of integration having page mode writing function can be provided.

A non-volatile semiconductor memory device in accordance with a still further aspect of the present invention includes a plurality of bit lines; a plurality of memory cells connected to the plurality of bit lines; a plurality of latches; and a selecting circuit. The plurality of latches are provided corresponding to the plurality of bit lines, and each holds a ground voltage or a high voltage in accordance with the write data. The selecting circuit periodically and repetitively selects each of the plurality of bit lines and the corresponding one of the latches, and connects the selected bit line to the selected latch.

The selecting circuit may include a plurality of nodes each commonly provided for a prescribe plurality of bit lines and a prescribed plurality of latches; a plurality of first transfer gates respectively connected between each of the plurality of bit lines and the corresponding one of the nodes; a plurality of second transfer gates respectively connected between each of the plurality of latches and the corresponding one of the nodes; and a counter for periodically and repetitively selecting and turning on each of the plurality of first transfer gates and each of the plurality of second transfer gates during programming.

In the non-volatile semiconductor memory device, each of the plurality of bit lines and the corresponding latches are periodically and repetitively selected during programming, and the selected bit line is connected to the selected latch. Consequently, the ground voltage or the high voltage held in each latch is supplied to the selected bit line. Therefore, the write voltage can be supplied to each bit line for a time sufficient for writing to the memory cells.

In the non-volatile semiconductor memory device, it is not necessary to provide the high voltage switch for each bit line. In addition, the plurality of latches can be arranged in the same direction as the bit lines. Therefore, the difficulty in pattern layout of the high voltage switches and the latches can be eliminated, providing margin in laying out elements. Consequently, a non-volatile semiconductor device suitable for higher degree of integration having page mode writing function can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows structures of the column latch and the Vpp switch.

FIG. 7 is a timing chart for illustrating the operation of the column latch and the Vpp switch.

FIG. 8 is a timing chart for illustrating the program cycle of the EEPROM of the second embodiment.

FIG. 23 is a timing chart for explaining the erasing/programming operation of the conventional EEPROM.

DESCRIPTION OF THE PREFERRED EMBODIMENTS (1) First Embodiment

Figure 21:
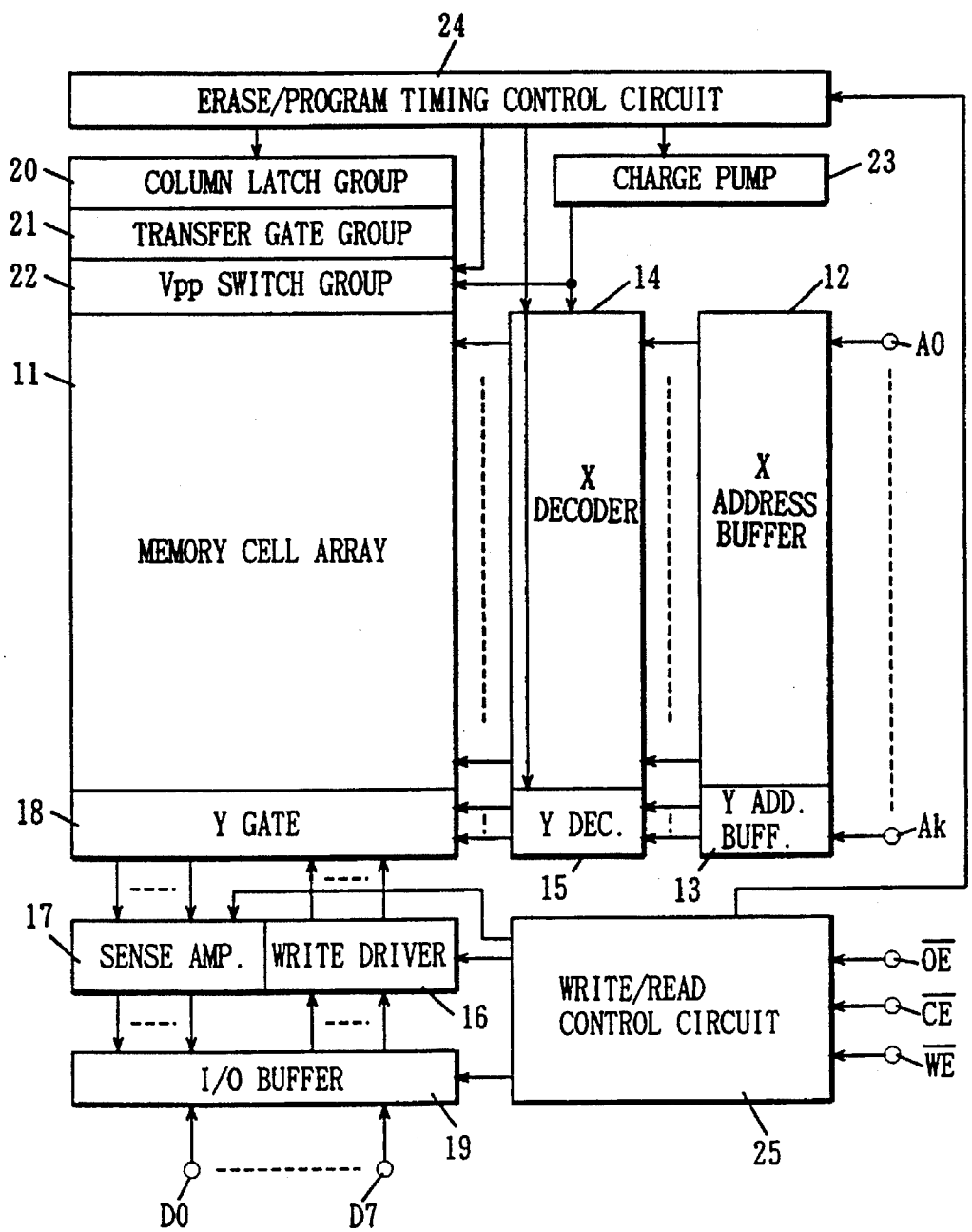
FIG. 21 is a block diagram showing the structure of a conventional EEPROM.

The EEPROM in accordance with the first embodiment shown in FIG. 1 differs from the conventional EEPROM of FIG. 21 in the following points. Namely, the column latch group 20, the transfer gate group 21 and the Vpp switch group 22 in the EEPROM of FIG. 21 are eliminated, and an address counter 26 and a data latch 27 are newly provided.

Address counter 26 is controlled by an erasure/program timing control circuit 24a. An output signal from address counter 26 is applied to Y address buffer 13. Data latch 27 is arranged between I/O buffer 19 and Y gate 18. Data latch 27 receives an output signal from Y decoder 15, and latches write data input from I/O buffer 19. Other structures are the same as those shown in FIG. 21.

Figure 1:
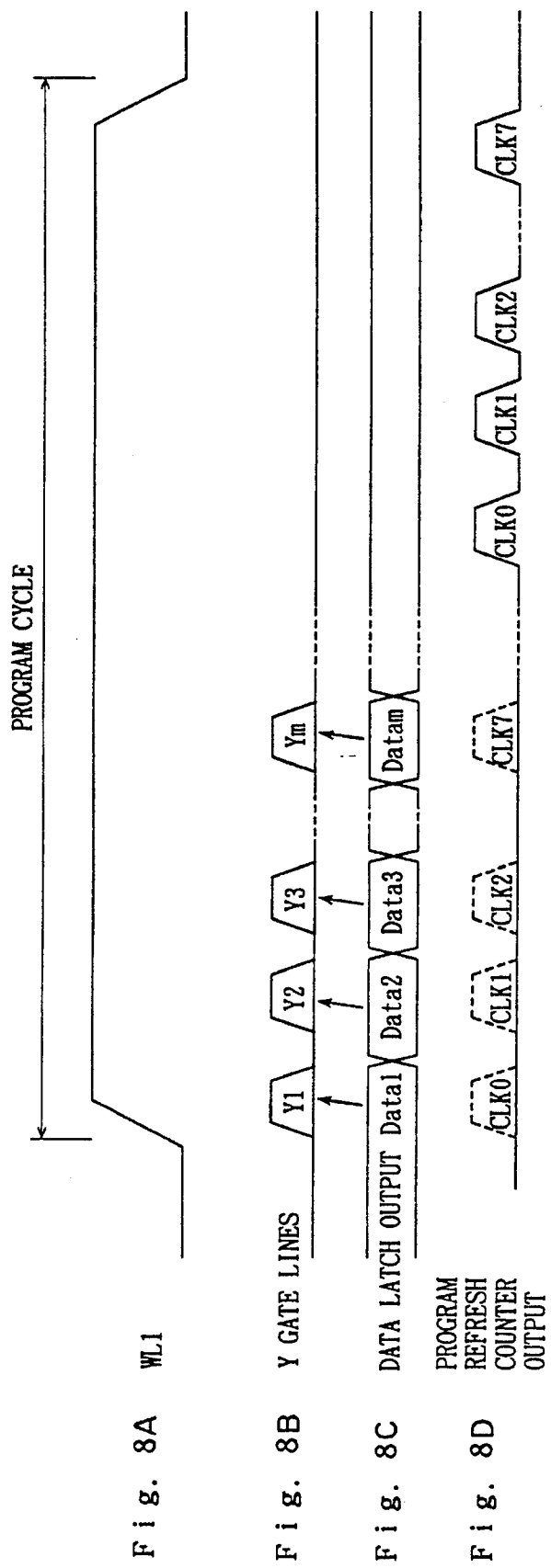
FIG. 1 is a block diagram showing a structure of an EEPROM in accordance with a first embodiment of the present invention.
Figure 2:
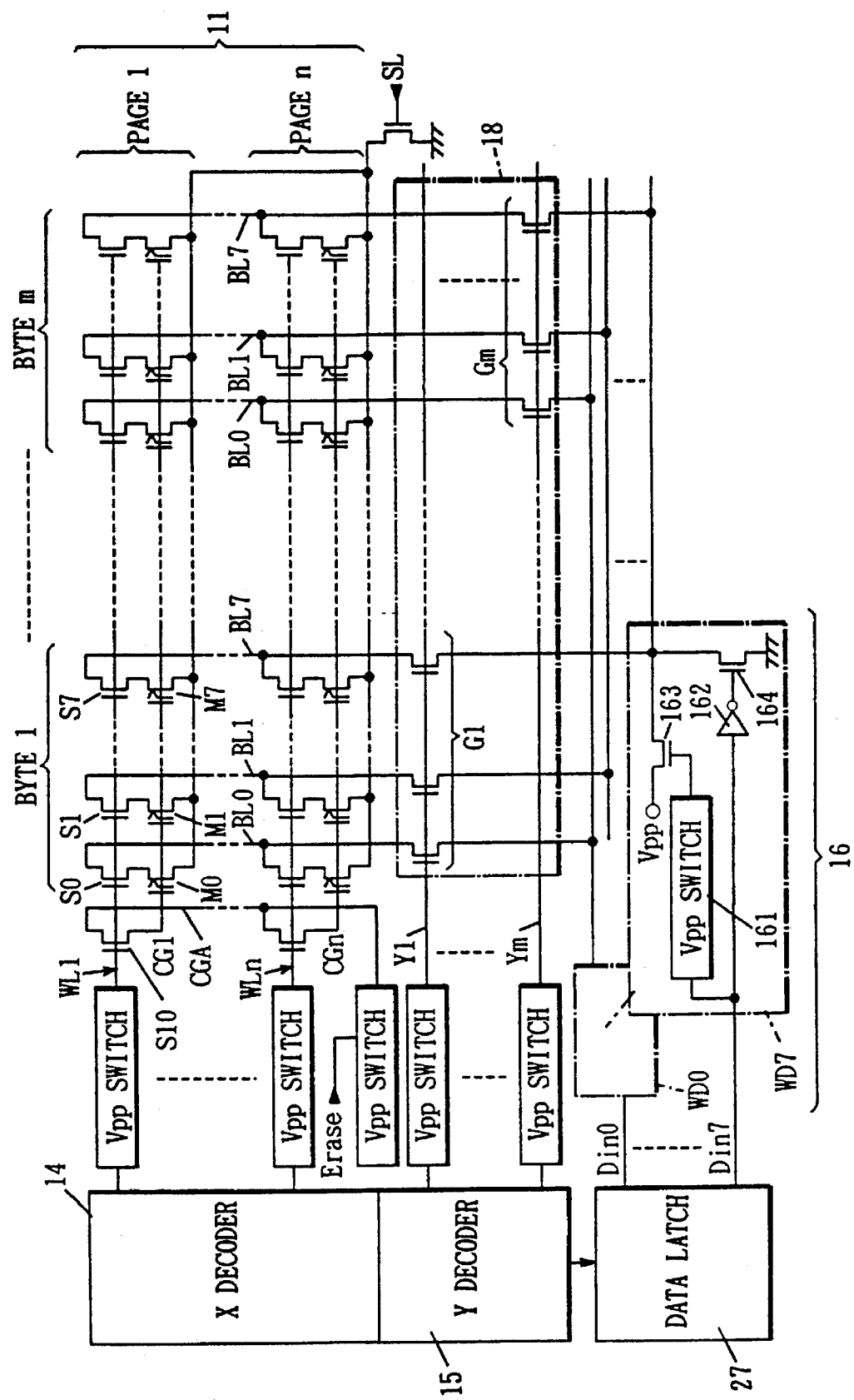
FIG. 2 shows detailed structure of the main portion of the EEPROM shown in FIG. 1.
Figure 22:
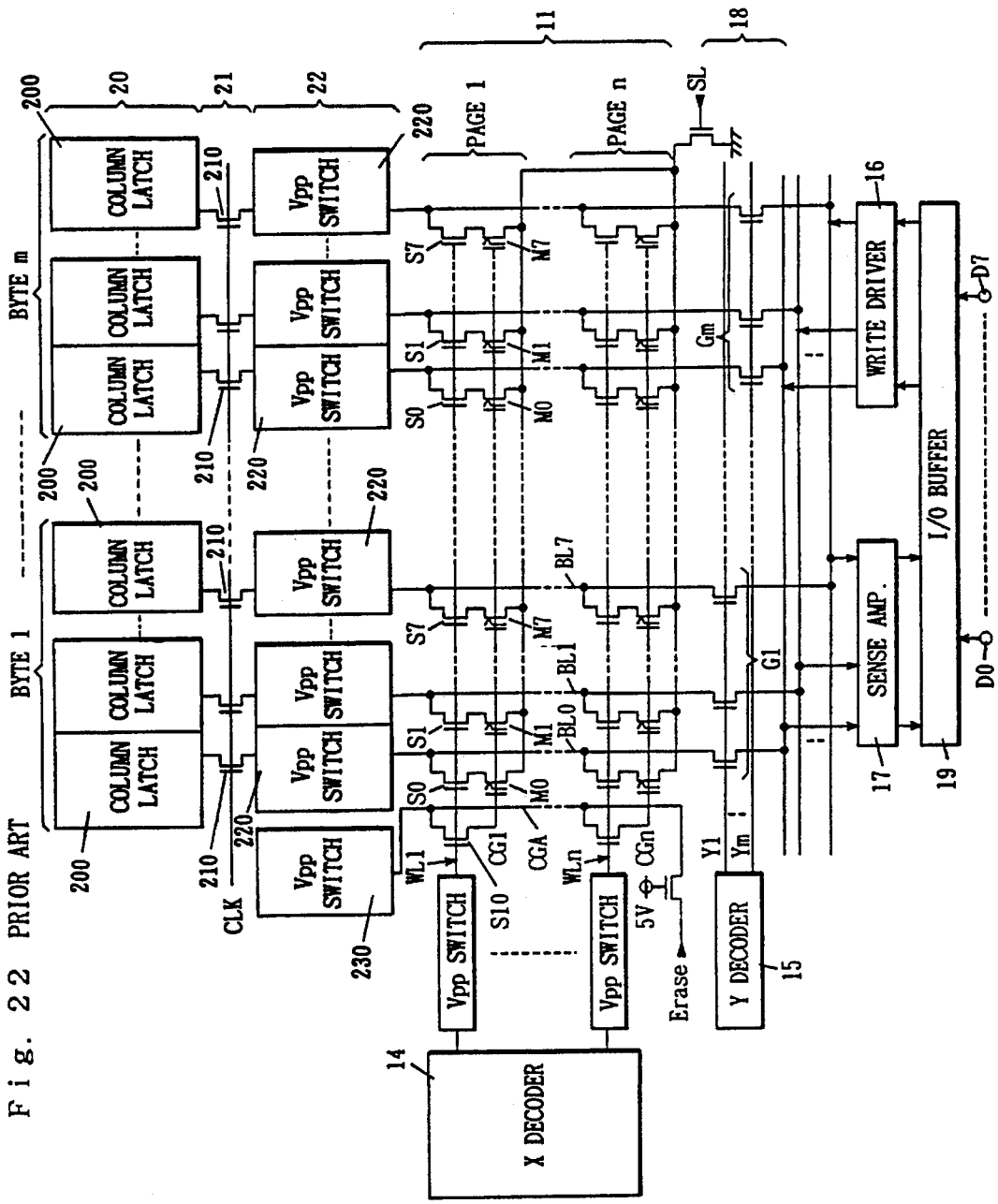
FIG. 22 shows details of the main portion of the EEPROM shown in FIG. 21.

FIG. 2 is a circuit diagram showing memory cell array 11 and the periphery thereof shown in FIG. 1 in detail. The structure of memory cell array 11 is the same as that of memory cell array 11 shown in FIG. 22.

Write driver 16 includes 8 driver circuits WD0 to WD7. Each driver circuit includes an Vpp switch 161, an inverter 162 and N channel MOS transistors 163 and 164. Data Din0 to Din7 read from data latch 27 are respectively applied to driver circuits WD0 to WD7 of write driver 16.

A series of erasing/programming operations of the EEPROM will be described with reference to FIG. 2. It is assumed that the memory cells of page 1 of FIG. 2 are to be rewritten.

Write Cycle

First, write data input through data input/output terminals D0 to D7 of FIG. 1 is applied to data latch 27 through I/O buffer 19 of FIG. 1. The write data is stored in a prescribed address of data latch 27 selected by Y decoder 15.

After the write data corresponding to all the bytes 1 to m in page 1 are stored in data latch 27, all memory cells in page 1 are erased.

Erasing Cycle

By X decoder 14, the potential of word line WL1 is raised to high voltage Vpp. The erasure signal Erase attains "H". Consequently, the high voltage Vpp is transmitted through transistor S10 to control gate CG1, and all memory cells in page 1 are erased. When the erasing cycle ends, the program cycle starts.

Program Cycle

Figure 3:
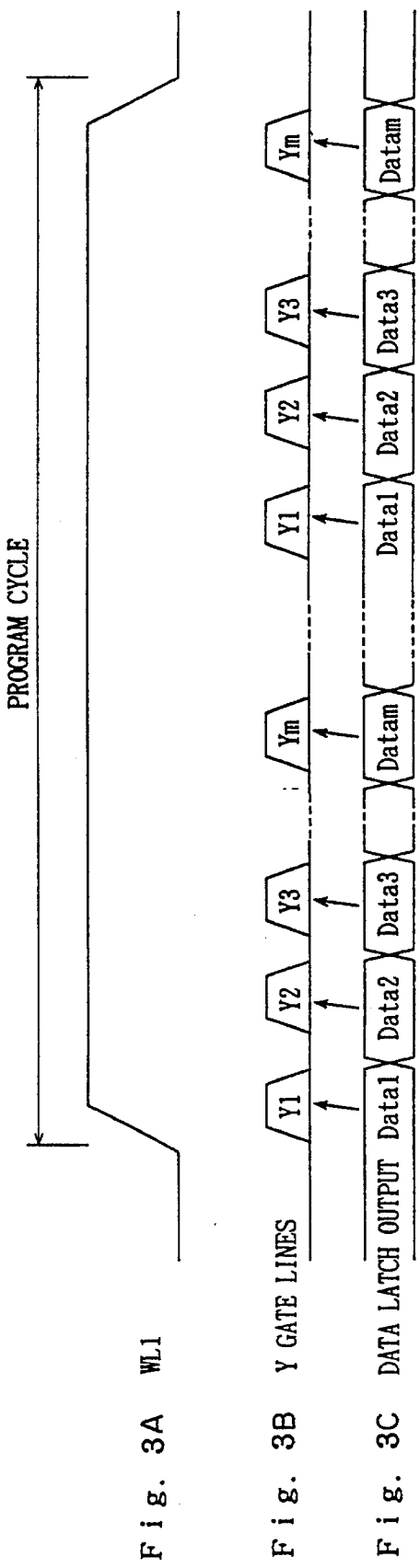
FIG. 3 is a timing chart illustrating the program cycle of the EEPROM of the first embodiment.

FIG. 3 is a timing chart showing the program cycle. First, address counter 26 is activated by erasures/programming timing control circuit 24a of FIG. 1. Address counter 26 periodically and repetitively selects Y addresses from the start to the end of the program cycle.

First, in response to an output signal from address counter 26, Y decoder 15 selects Y gate line Y1. Consequently, the voltage of Y gate line Y1 rises to the high voltage Vpp and transfer gate G1 turns on.

At the same time, Y decoder 15 selects an address corresponding to byte 1 of data latch 27. Consequently, the write data corresponding to byte 1 stored in data latch 27 is transmitted to write driver 16. Driver circuits WD0 to WD7 of write driver 16 generate high voltage Vpp when write data Din0 to Din7 from data latch 27 indicate the programmed state, and generates 0 V when they indicate the erased state.

Output from write driver 16 is transmitted to bit lines BL0 to BL7 of byte 1 through transfer gate G1. At this time, the voltage of word line WL1 corresponding to page 1 has risen to high voltage Vpp. Therefore, write voltage of 0 V or high voltage Vpp is applied to tunneling regions of memory transistors M0 to M7 through selected transistors S0 to S7 of the memory cells in byte 1.

As shown in FIG. 3, address counter 26 (FIG. 1) is counted up and Y gate line Y2 is selected after the lapse of a prescribed time period. In this case also, write voltage is applied to bit lines BL0 to BL7 of byte 2 from write driver 16 in accordance with the data corresponding to byte 2 of the data latch 27. In the similar manner, selection is continued up to Y gate line Ym corresponding to byte m successively, and write data are applied to corresponding bit lines BL0 to BL7.

After the selection of Y gate line Ym, Y gate line Y1 corresponding to byte 1 is again selected, and in the similar manner, Y gate lines are successively selected up to Y gate line Ym corresponding to byte m. This operation is repeated for the period of the program cycle determined by erasure/program timing control circuit 24a.

Generally, it takes several ms in order to program memory cells utilizing the tunneling effect. Therefore, address counter 26 is kept active for this period, so as to apply the write voltage to the memory cells successively.

If it is assumed that one period of selection of each byte is, for example 1 μs, that byte is selected next after the lapse of mμs, since there are m bytes of memory cells in one page. For this time period, the supply source of the write voltage to the memory cells is cut. However, the current flowing because of the tunnelling effect is about several ten pA to several nA. Therefore, the write voltage can be sufficiently supplied by the charges in the parasitic capacitance (generally, 1 to 2 pF) of the bit lines.

In accordance with the above described first embodiment, transfer gates G1 to Gm in Y gate 18 are periodically and repetitively selected by the activation of address counter 26 in the program cycle, and write voltage of 0 V or of the high voltage Vpp is applied periodically to the bit lines of the memory cell array 11 in accordance with the write data stored in data latch circuit 27.

Therefore, an EEPROM of a program method type not using the high voltage switches (Vpp switch) for the bit lines can be realized, and therefor pattern layout can be done with sufficient margin even if the degree of integration becomes higher.

In the EEPROM in accordance with the above described first embodiment, a control gate is common to all the memory cells in the same page, and therefor the memory cells in the same page are always erased at one time. However, the present invention can be applied to an EEPROM in which each of the memory cells in the same page has a separate control gate, allowing independent erasure.

(2) Second Embodiment

An EEPROM in accordance with the second embodiment shown in FIG. 4 differs from the conventional EEPROM shown in FIG. 21 in the following points.

Instead of column latch group 20, transfer gate group 21 and Vpp switch group 22 of the EEPROM shown in FIG. 21, a column latch group 30, a Vpp switch group 31 and a transfer gate group 32 are provided, and an address counter 26, a data latch 27, a program refresh counter 28 and a Vpp switch group 29 are newly provided.

Address counter 26 is controlled by erasure/program timing control circuit 24b. An output signal from address counter 26 is input to Y address buffer 13. Data latch 27 is arranged between I/O buffer 19 and Y gate 18. Data latch 27 receives an output signal from Y decoder 15 and latches write data input from I/O buffer 19.

Program refresh counter 28 applies a clock signal to transfer group 32 through Vpp switch group 29 in the program cycle, and switches connection between Vpp switches in Vpp switch group 31 and the bit lines in memory cell array 11. Consequently, the write voltage is applied to the bit lines from each of the Vpp switches. Other structures are the same as those shown in FIG. 21.

Figure 4:
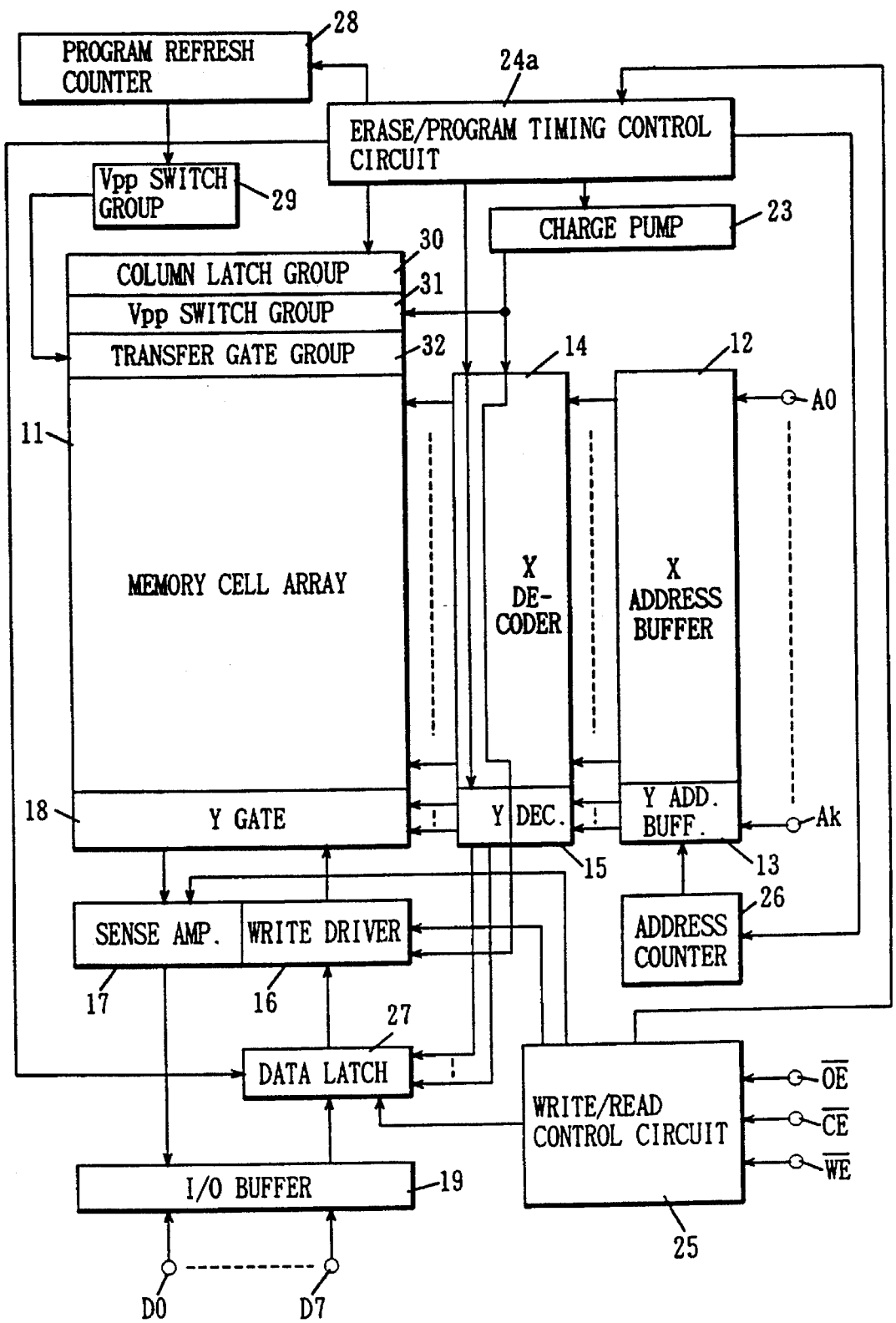
FIG. 4 is a block diagram showing a structure of an EEPROM in accordance with a second embodiment of the present invention.
Figure 5:
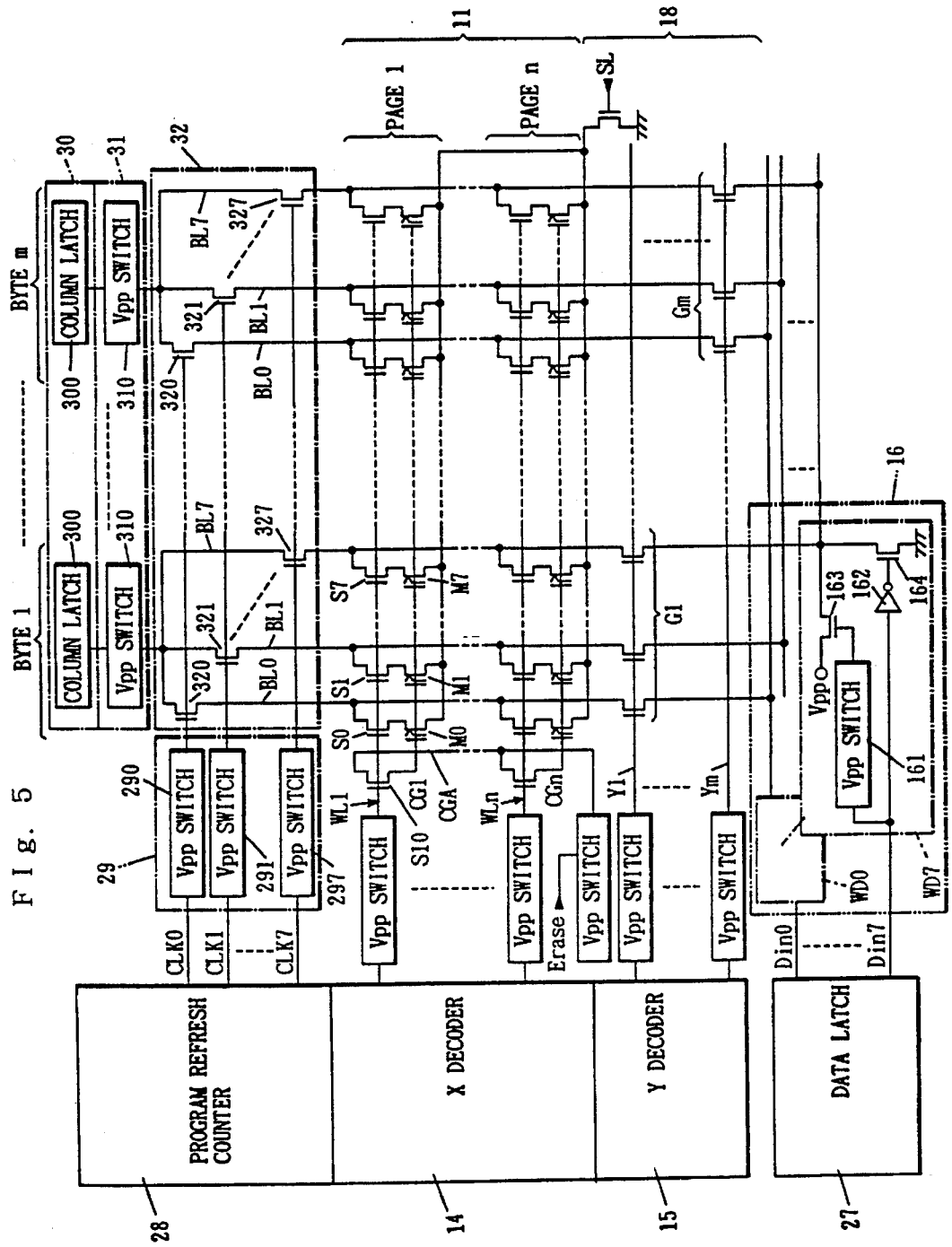
FIG. 5 shows details of the structure of the main portion of the EEPROM shown in FIG. 4.

FIG. 5 is a circuit diagram showing, in detail, the structure of memory cell array 11 and the periphery thereof shown in FIG. 4.

Referring to FIG. 5, column latch group 30 includes m column latches 300 corresponding to m bytes. Vpp switch group 31 includes m Vpp switches 310 corresponding to m bytes. Namely, one column latch 300 and one Vpp switch 310 are provided for each byte. Write voltage establishing means comprise the column latches 300 of the column latch group 30 and the Vpp switches 310 of the Vp switch group 31 in the embodiments of FIGS. 4 and 5.

Transfer gate group 32 includes a plurality of transfer gates 320 to 327 corresponding to the plurality of bit lines BL0 to BL7. The column latches 300 and Vpp switches 310 of each byte are respectively connected to bit lines BL0 to BL7 of the respective bytes through transfer gates 320 to 327.

Vpp switch group 29 includes 8 Vpp switches 290 to 297. Program refresh counter 28 applies clock signals CLK0 to CLK7 to Vpp switches 290 to 297 respectively. Output from Vpp switches 290 to 297 are applied to transfer gate 320 to 327, respectively. Selecting means include the plurality of transfer gates 320 to 327 and the program refresh counter 28 in the exemplary embodiment of FIGS. 4 and 5.

FIG. 6 shows details of column latch 300 and Vpp switch 310. Vpp switch 310 shown in FIG. 6 is a generally used Vpp switch which raises the voltage of node N1 to Vpp level in response to clock signal φ, when a high level potential is applied to the node N1. Column latch 300 receives the selected bit line at node N2, and generates a ground potential or a supply potential.

A series of erasing/programming operation of the EEPROM shown in FIGS. 4 and 5 will be described. It is assumed that memory cells of page 1 of FIG. 5 are to be rewritten.

Write Cycle

First, write data input through data input/output terminals D0 to D7 of FIG. 4 are input to data latch 27 through I/O buffer 19 (FIG. 4). At this time, Y decoder 15 selects a prescribed address in data latch 27 in response to a Y address signal. Consequently, the write data is stored in the selected address in data latch 27.

After the write data corresponding to all bytes 1 to m of page 1 are stored in data latch 27, all memory cells in page 1 are erased.

Erasing Cycle

First, the voltage of word line WL1 is raisen to the high voltage Vpp by X decoder 14. The erasing signal Erase attaines "H". Consequently, a high voltage Vpp is applied to control gate CG1 through transistor S10, and all the memory cells in page 1 are erased. When the erasing cycle ends, the program cycle starts.

Program Cycle

FIG. 8 is a timing chart showing the program cycle.

First, address counter 26 is activated by erasure/program timing control circuit 24b shown in FIG. 4. Address counter 26 successively selects Y addresses when the program cycle starts.

First, in response to an output signal from address counter 26, Y decoder 15 selects Y gate line Y1 and raises the voltage thereof to the high voltage Vpp. Consequently, transfer gate G1 turns on.

Simultaneously, Y decoder 15 selects an address corresponding to byte 1 of data latch 27. Consequently, write data corresponding to byte 1 stored in data latch 27 is transmitted to write driver 16. Driver circuits WD0 to WD7 of write driver 16 generate the high voltage Vpp when write data Din0 to Din7 from data latch 27 indicate the programmed state, and generates 0 V when they indicate the erased state. Write data supplying means can be considered to comprise the I/O buffer 19, the data latch 27, and the write drive 16 in the embodiment of FIGS. 4 and 5.

Consequently, an output from write driver 16 is transmitted to bit lines BL0 to BL7 of byte 1 through transfer gate G1. At this time, since the voltage of word line WL1 corresponding to page 1 has risen to the high voltage Vpp, the write voltage of 0 V or the high voltage Vpp is applied to tunneling regions of memory transistors M0 to M7 through selecting transistors S0 to S7 of the memory cells in byte 1.

As shown in FIG. 8, after a lapse of a prescribed time period, address counter 26 (FIG. 4) is counted up, and Y gate line Y2 is selected. In this case also, write voltage is applied to bit lines BL0 to BL7 of byte 2 from write driver 16, in accordance with the data corresponding to byte 2 in data latch 27. Similarly, the Y gate lines are selected up to Y gate line Ym corresponding to byte m, and the write voltage is applied to corresponding bit lines BL0 to BL7.

By the above described operation, the parasitic capacitances $C_{BL0}$ and $C_{BL7}$ (see FIG. 6) of the bit lines BL0 to BL7 in each byte are charged to the high voltage Vpp or discharged to 0 V.

After the selection of Y gate line Ym corresponding to byte m, address counter 26 is rendered inactive, and all the transfer gates G1 to Gm are kept off until the end of the program cycle.

Then, refresh counter 28 is activated, and clock signals CLK0 to CLK7 rise successively. Consequently, transfer gates 320 to 327 in each byte turns on successively, and bit lines BL0 to BL7 in each byte are successively connected to the column latches 300 and Vpp switches 310 existing in each byte.

As shown in FIG. 7, before the rise of clock signal CLK0, a reset signal RESET rises. Consequently, node N1 of Vpp switch 310 shown in FIG. 6 attains 0 V. Thereafter, clock signal CLK0 rises. Consequently, corresponding Vpp switch 290 is activated, and the high voltage Vpp is applied to transfer gate 320. Consequently, bit line BL0 is connected to the corresponding column latch 300 and Vpp switch 310.

If the high voltage Vpp is charged in parasitic capacitance $C_{BL0}$ of bit line BL0, Vpp switch 310 is activated. If the potential of bit line BL0 is approximately 0 V, Vpp switch 310 remains inactive.

A certain delay time after the rise of clock signal CLK0, a set signal SET rises. After this delay time, column latch 300 receives the potential of bit line BL0 and generates 0 V or 5 V (assuming that the external supply potential is 5 V) at node N2. Since set signal SET rises, the voltage of bit line BL can be established at the high voltage Vpp or at 0 V.

Similarly, clock signals CLK1 to CLK7 rise successively, and bit lines BL1 to BL7 in each byte are successively connected to column latches 300 and Vpp switches 310.

In this manner, by periodically and repetitively raising clock signals CLK0 to CLK7, bit lines BL0 to BL7 in each byte can be periodically connected to column latches 300 and Vpp switches 310. Consequently, memory cells can be programmed.

As described above, generally it takes several ms for programming memory cells by utilizing the tunneling effect. Therefore, program refresh counter 28 is kept active for this period, and the write voltage is successively applied to the memory cells.

If it is assumed that one selecting period of each bit line is 1 μs, that bit line is selected next after 7 μs, since column latches 300 and Vpp switches 310 are provided byte by byte. Therefore, for this period, the supply source of the write voltage to the memory cells is cut. However, write voltage can be sufficiently supplied because of the charges in the parasitic capacitance (generally 1 to 2 pF) of the bit lines.

As to the bit lines to which 0 V is applied, the supply source of the potential of 0 V is similarly cut. Therefore, the potential of that bit line may rise due to the influence from peripheral memory cells. However, the potential of 0 V is supplied by the column latch 300 when that bit line is selected by the clock signal, making the operation stable.

In the above description, program refresh counter 28 is activated after address counter 26 is made inactive. However, program refresh counter 28 may be activated simultaneously with the start of the program cycle, and clock signals CLK0 to CLK7 may be successively raised at prescribed period until the end of the program cycle, as shown by the dotted line in FIG. 8. The operation at that case will be described.

While byte 1 is selected by address counter 26 (FIG. 4), clock signal CLK0 rises. Consequently, bit line BL0 in each byte is connected to column latch 300 and Vpp switch 310 through transfer gate 320. Next, while byte 2 is selected by address counter 26, clock signals CLK1 rises. Consequently, bit line BL1 in each byte is connected to column latch 300 and Vpp switch 310 through transfer gate 321.

In this manner, when byte 9 is selected by address counter 26, for example, program refresh counter 28 raises clock signal CLK0. At this time, since transfer gate 320 corresponding to clock signal CLK0 turn on in bytes 1 to 8 to which write voltage has already been applied by write driver 16, bit line BL0 in each byte is connected to column latch 300 and Vpp switch 310 in each byte.

In this manner, the bytes are selected up to byte m, and after the end of selection of byte m, address counter 16 stops its operation, and all transfer gates G1 to Gm turn off. However, program refresh counter 28 periodically repeats the above described operation during the program period determined by erasure/program timing control circuit 24b (FIG. 4). Consequently, memory cells can be programmed.

In the above described second embodiment, a pair of column latch 300 and Vpp switch 310 are provided for one byte, and bit lines BL0 to BL7 in each byte are connected to the pair of column latch 300 and Vpp switch 310 through transfer gates 320 to 327. In the program cycle, transfer gates 320 to 327 in each byte are periodically turned on by clock signals CLK0 to CLK7 generated periodically from program refresh counter 38.

Therefore, the number of column latches 300 and of Vpp switches 310 necessary for each byte can be made one eighth of the conventional EEPROM. Consequently, the element can be laid out with margin, and an EEPROM suitable for higher degree of integration can be provided.

After address counter 26 is made inactive, only the program refresh counter 28 operates, and by detecting voltages of parasitic capacitances $C_{BL0}$ to $C_{BL7}$ of bit lines BL0 to BL7 in each byte, Vpp switch 310 is activated. Consequently, the write voltage can be refreshed periodically, reinforcing the potential level of the bit lines.

In the EEPROM in accordance with the above described second embodiment, a control gate is common to the memory cells of the same page, and therefor the memory cells of the same page are always erased at one time. However, the present invention can be applied to an EEPROM in which each of the memory cells of the same page has a separate control gate, allowing independent erasure.

(3) Third Embodiment

An EEPROM in accordance with the third embodiment shown in FIG. 9 differs from the conventional EEPROM shown in FIG. 21 in the following points.

Instead of column latch group 20, transfer gate group 21 and Vpp switch group 22 in the EEPROM of FIG. 21, a column latch group 35, a transfer gate group 36, a Vpp switch group 37 and a transfer gate group 38 are provided, and program refresh counter 33 and Vpp switch 34 are further provided.

Transfer gate group 36 transmits data held in column latch group 35 to vpp switch group 37. Transfer gate group 38 connects Vpp switch group 37 to bit lines in memory cell array 11. Program refresh counter 33 is controlled by erasure/program timing control circuit 24c and control transfer gate groups 36 and 38 at writing.

Figure 9:
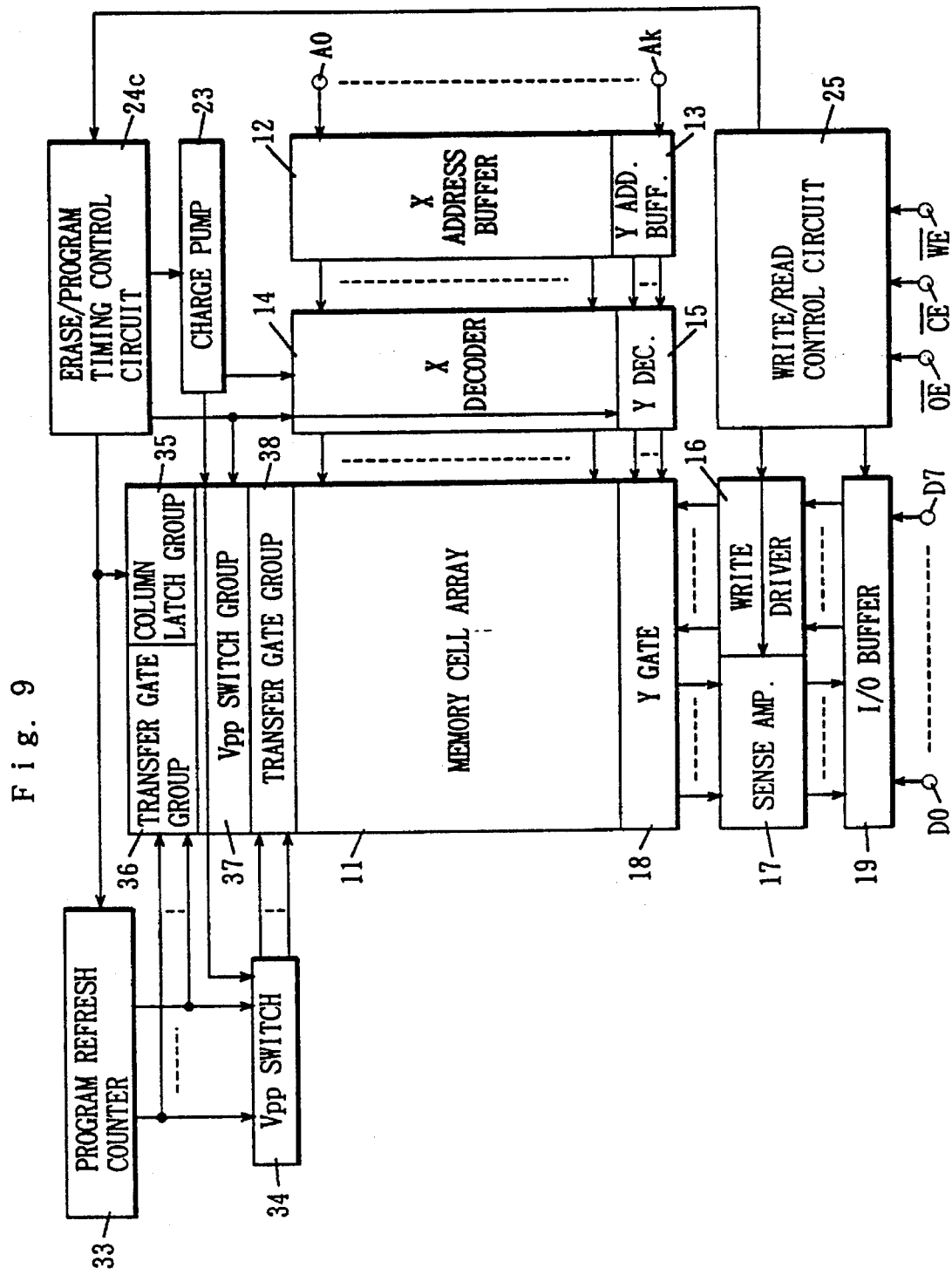
FIG. 9 is a block diagram showing the structure of an EEPROM in accordance with a third embodiment of the present invention.
Figure 10:
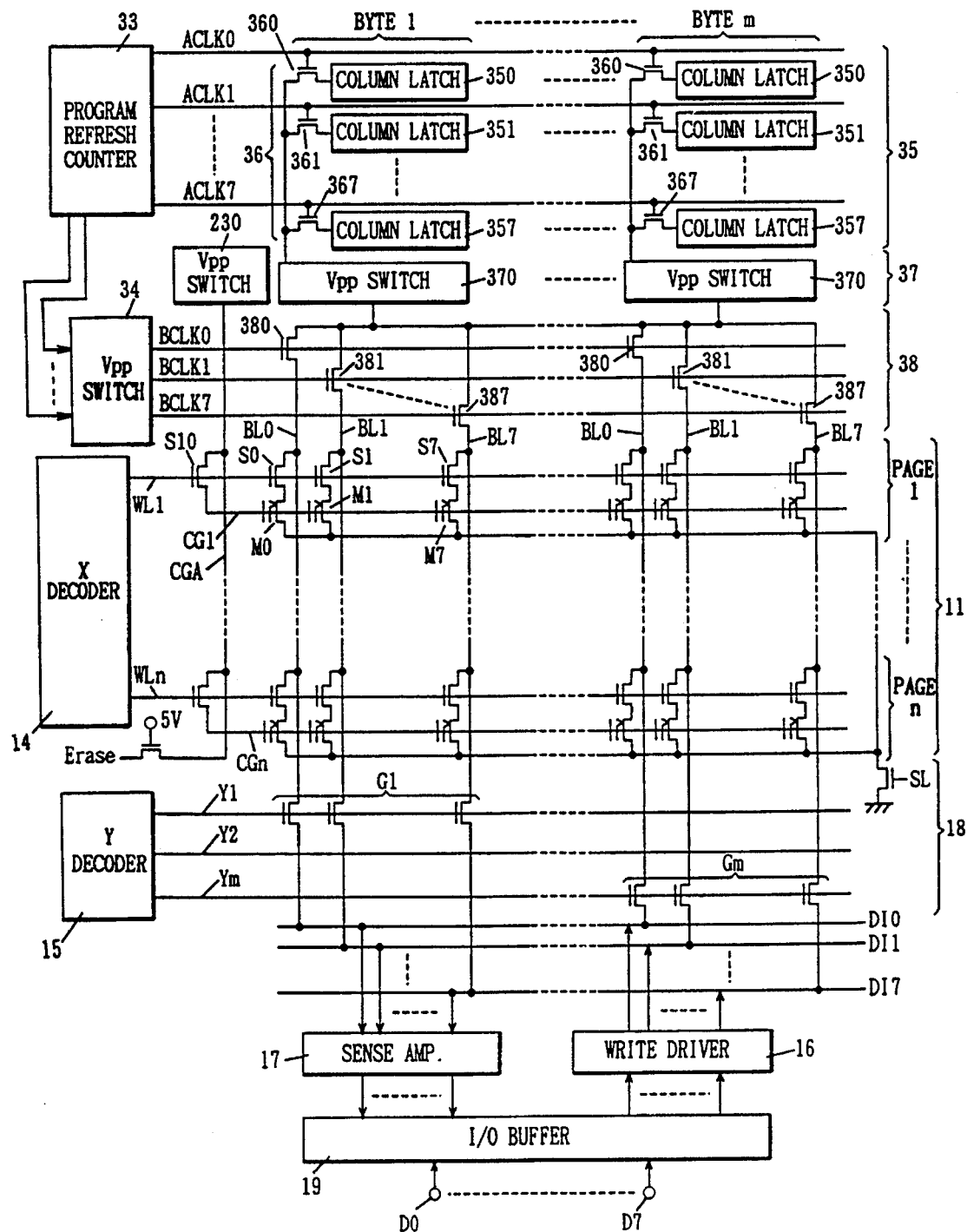
FIG. 10 shows details of the structure of the main portion of the EEPROM shown in FIG. 9.

FIG. 10 shows in detail the structure of memory cell array 11 and the periphery thereof shown in FIG. 9.

Column latch group 35 includes a plurality of column latches 350 to 357. 8 column latches 350 to 357 are provided for each byte. Transfer gate group 36 includes a plurality of transfer gates 360 to 367. 8 transfer gates 360 to 367 are provided for each byte.

Vpp switch group 37 includes m Vpp switches 370 corresponding to m bytes. Transfer gate group 38 includes a plurality of transfer gates 380 to 387. 8 transfer gates 380 to 387 are provided for each byte.

Program refresh counter 33 supplies clock signals ACLK0 to ACLK7 to transfer gates 360 to 367 of each byte, respectively. Program refresh counter 33 applies clock signals BCLK0 to BCLK7 to transfer gate 380 to 387 in each byte, respectively, through Vpp switch 34.

X decoder 14 and Y decoder 15 include Vpp switches.

A series of erasing/programming operation of the EEPROM shown in FIGS. 9 and 10 will be described. It is assumed that memory cells of page 1 of FIG. 10 are to be rewritten.

Write Cycle

Figure 11:
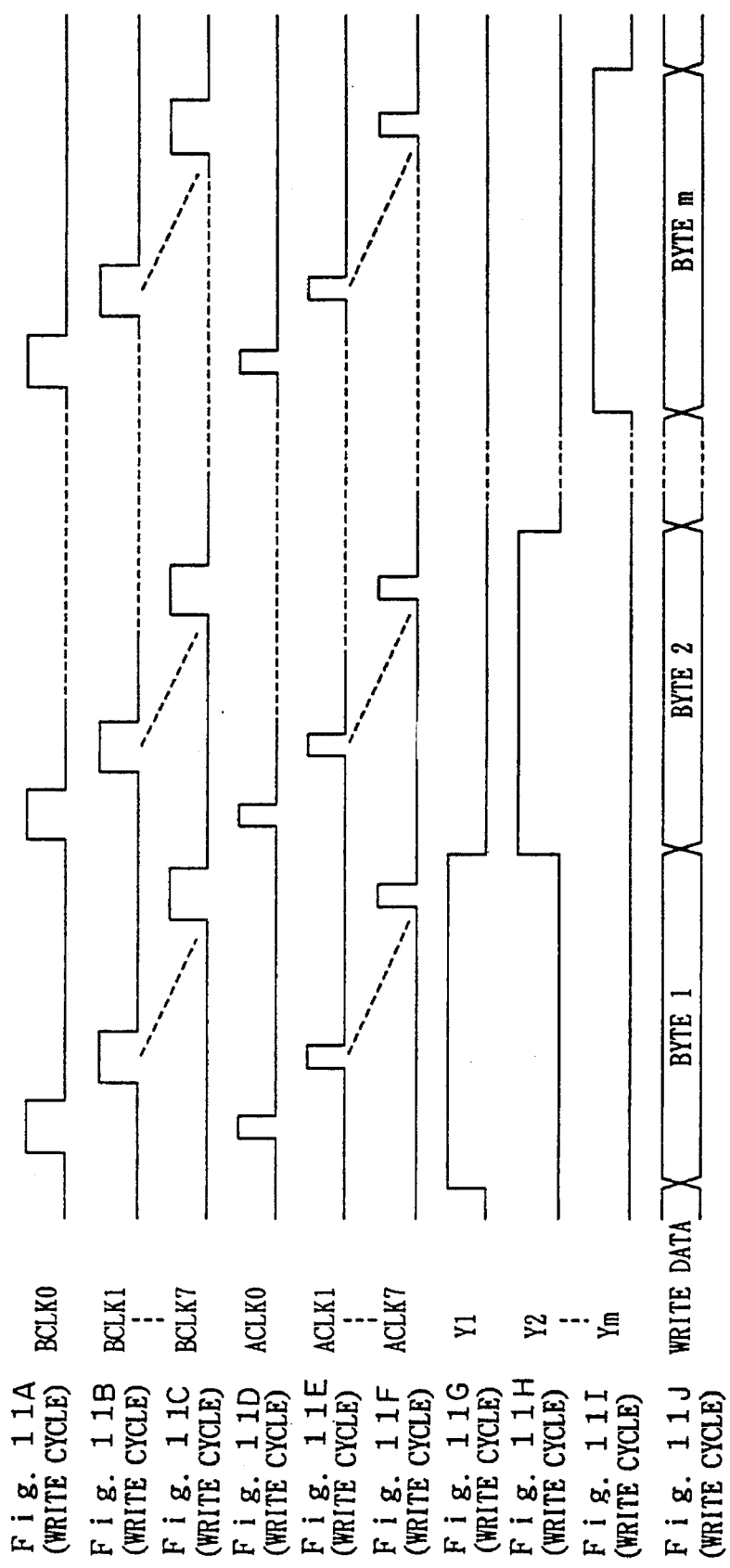
FIG. 11 is a timing chart for illustrating the write cycle of the EEPROM of the third embodiment.

FIG. 11 is a timing chart showing the writing cycle. The write cycle corresponds to the period T1 of the timing chart of the conventional EEPROM shown in FIG. 23.

First, write data input from data input/output terminals D0 to D7 are transmitted to write driver 16 through I/O buffer 19. Y gate line Y1 is selected by Y decoder 15. Consequently, transfer gate G1 turns on.

At this time, program refresh counter 33 operates and successively raises clock signals ACLK0 to ACLK7 and BCLK0 to BCLK7.

After a prescribed delay time after the rise of clock signal BCLK0, for example, clock signal ACLK0 rises. Consequently, transfer gates 380 and 360 turn on. Thus, write data DI0 output from write driver 16 is written to column latch 350 of byte 1 through bit line BL0 of byte 1.

After the end of writing to column latch 350, clock signal ACLK0 falls, and after a prescribed delay time, clock signal BCLK0 falls. Consequently, transfer gates 360 and 380 turn off.

Then, clock signals BCLK1 and ACLK1 successively rise, and write data DI1 output from write driver 16 is written to column latch 351 of byte 1 through bit line BL1 of byte 1. In this manner write data DI0 to DI7 output from write driver 16 are successively written to column latches 350 to 357 in byte 1.

Y decoder 15 successively selects Y gate lines Y2 to Ym, and in the similar manner, write data are written to column latches 350 to 357 of byte 2 to byte m.

In write cycle, Vpp switch 34 has not yet generated the high voltage Vpp, and clock signals BCLK0 to BCLK7 are at the supply voltage level (generally 5 V).

After the write data of all the bytes 1 to m in page 1 have been stored, all the memory cells in page 1 are erased in the similar manner as in the conventional EEPROM.

Erasing Cycle

Figure 12:
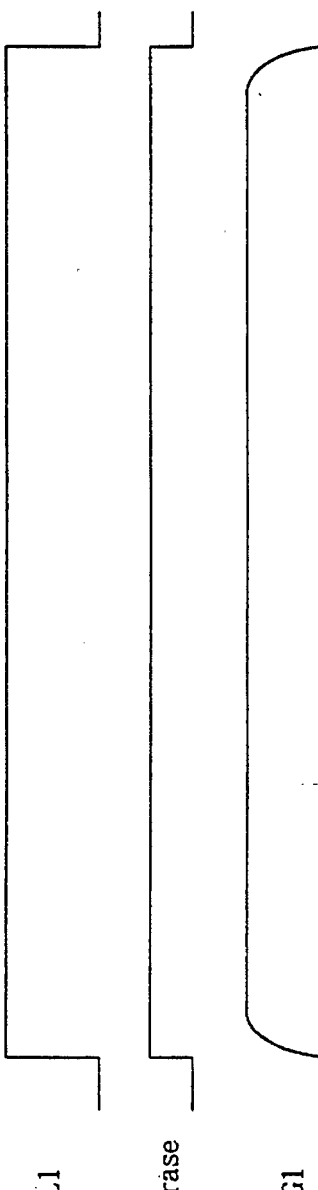
FIG. 12 is a timing chart for explaining the erasing cycle of the EEPROM of the third embodiment.

FIG. 12 is a timing chart showing the erasing cycle. The erasing cycle corresponds to the period T2 in the timing chart of the conventional EEPROM shown in FIG. 23.

X decoder 14 raises the voltage of word line WL1 to the high voltage Vpp. The erasing signal Erase attains "H". Consequently, Vpp switch 230 is activated, and the high voltage Vpp is transmitted to control gate CG1 through transistor S10. Thus all the memory cells in page 1 are erased. When the erasing cycle ends, the program cycle starts.

Program Cycle

Figure 13:
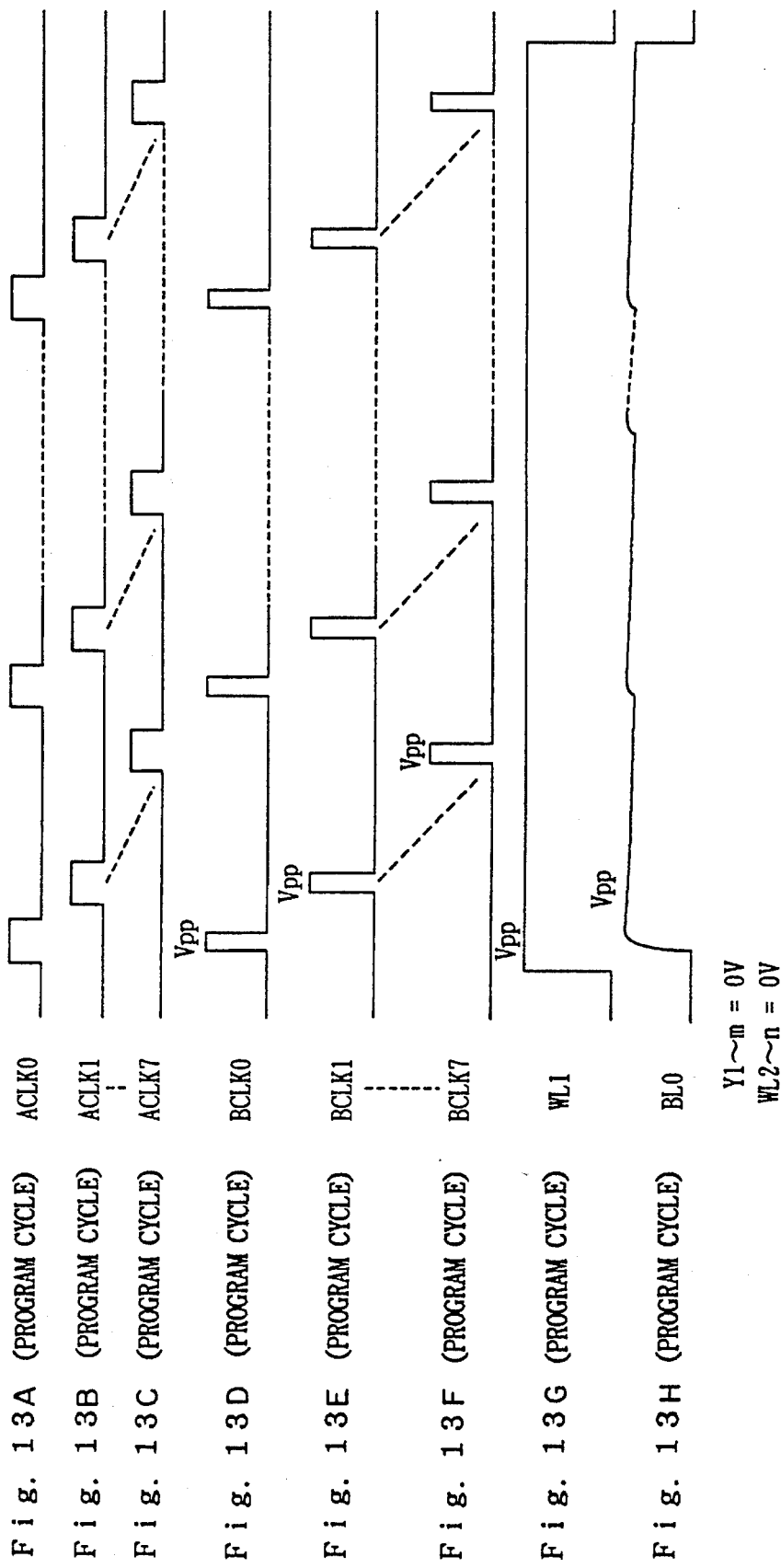
FIG. 13 is a timing chart for illustrating the programming cycle of the EEPROM of the third embodiment.

FIG. 13 is a timing chart showing the program cycle. The program cycle corresponds to the period T3 in the timing chart of the conventional EEPROM shown in FIG. 23.

Program refresh counter 33 operates and clock signals ACLK0 to ACLK7 and BCLK0 to BCLK7 successively rise.

At first, clock signal ACLK0 rises, and transfer gate 360 of each byte turns on. Consequently, column latch 350 of each byte is connected to Vpp switch 370. If the write data held in column latch 350 is "0", then corresponding Vpp switch 370 is made active, while if it is "1", the corresponding Vpp switch 370 is made inactive.

After each Vpp switch 370 is stabilized, clock signal BCLK0 rises, and transfer gate 380 turns on. At this time, clock signal BCLK0 attains the level of the high voltage Vpp. Therefore, the high voltage Vpp is applied to bit line BL0 connected to the activated Vpp switch 370.

Since the voltage of word line WL1 has risen to the high voltage vpp, the write voltage of 0 V or of the high voltage Vpp is applied to the tunnelling region of memory transistor M0 through the selecting transistor S0 of the memory cell connected to each bit line BL0 in page 1. After a prescribed time period, clock signal BCLK0 falls and clock signal ACLK0 falls.

Then clock signals ACLK1 and BCLK1 rise, and column latch 351 in each byte is connected to corresponding Vpp switch 370, and the vpp switch 370 is further connected to the corresponding bit line BL1.

In this manner, clock signals ACLK0 to ACLK7 and clock signals BCLK0 to BCLK7 successively rise. When clock signals ACLK7 and BCLK7 fall, clock signals ACLK0 and BCLK0 rise again, and the above described operation is repeated.

As described above, by repetitively raising clock signals ACLK0 to ACLK7 and BCLK0 to BCLK7 periodically, memory cells can be programmed.

In order to program the memory cells by utilizing the tunnelling effect, it takes several ms generally. Therefore, program refresh counter 33 is rendered active for this period, and write voltage is applied successively to the memory cells.

If it is assumed that one selecting period of each bit line (pulse width of clock signals BCLK0 to BCLK7) is 1 μs, for example, then that bit line is selected next after 7 μs. During this period, supply source of the write voltage to the memory cells is cut. However, the current consumed by the tunneling effect is about several ten pA to several nA. Therefore, write voltage can be supplied sufficiently by the charges in the parasitic capacitance (generally 1 to 2 pF) of the bit lines.

As shown in FIG. 13, the potential of the bit line lowers to some extent. However, by setting the frequency of the clock signals ACLK0 to ACLK7 and BCLK0 to BCLK7 so that potential enough to generate the tunnelling effect is kept, programming of the memory cells can be carried out stably.

FIG. 13 shows the state of bit line BL0 out of bit lines BL0 to BL7 as a representative.

In the EEPROM of the third embodiment described above, a control gate is common to the memory cells of the same page, and the memory cells of the same page are always erased at one time. However, the present invention can be applied to an EEPROM in which each of the memory cells of the same page has a separate control gate allowing independent erasure and having page mode writing function.

Figure 14:
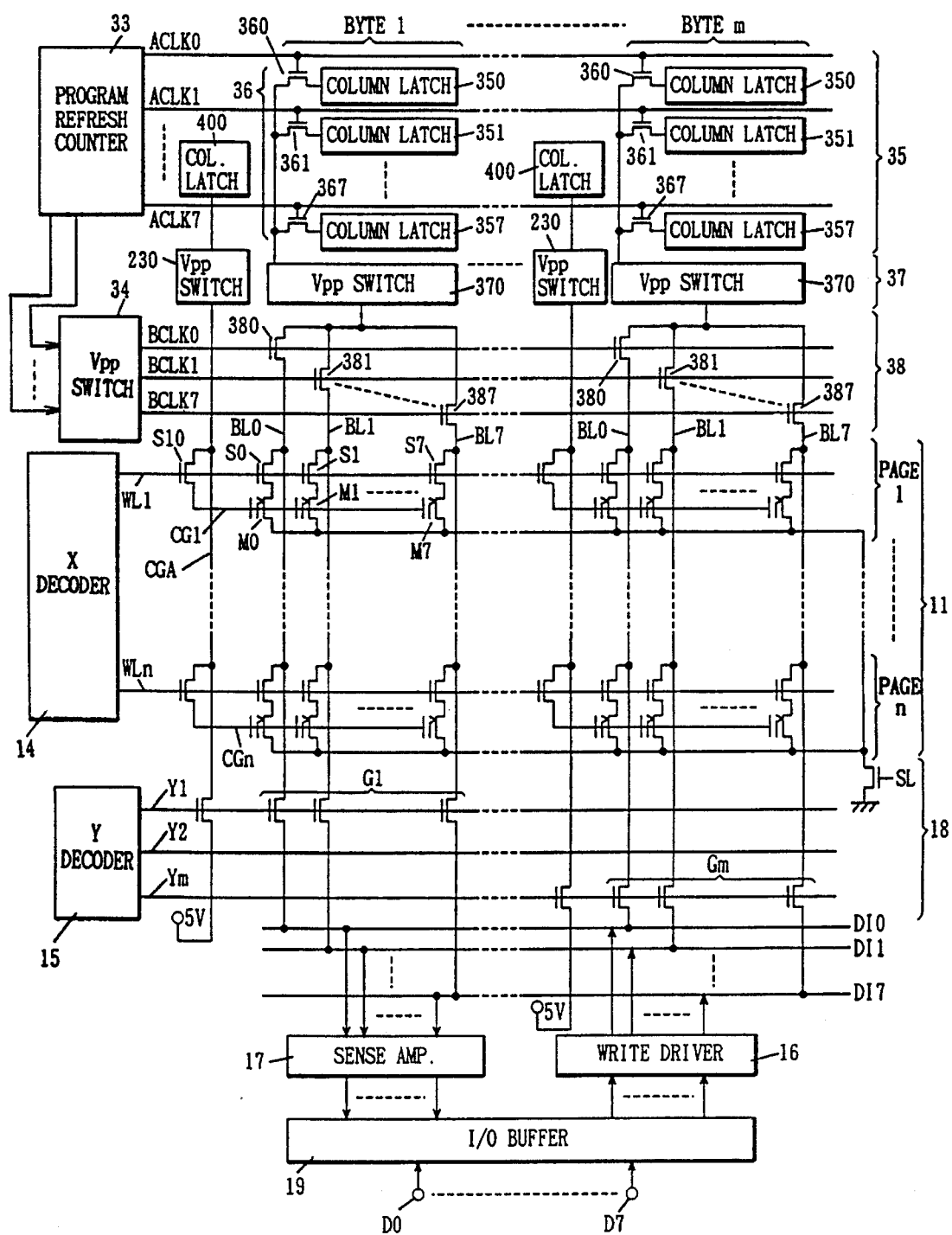
FIG. 14 shows another example of the structure of the main portion of the EEPROM of the third embodiment.

Referring to FIG. 14, a Vpp switch 230 and a column latch 400 are provided for each byte. The control gate of the memory cells is common in each byte in each page. Each column latch 400 holds data for designating whether or not the memory cells of the corresponding byte are to be rewritten.

In the embodiment of FIG. 10, when write data is written to column latches 350 to 357, transfer gates 360 to 367 of the bytes not selected by Y decoder 15 are also turned on by clock signals ACLK0 to ACLK7. If the structure is adapted to turn on the transfer gates 360 to 367 only of the byte selected by Y decoder 15, latching of write data can be done more stably.

Figure 15:
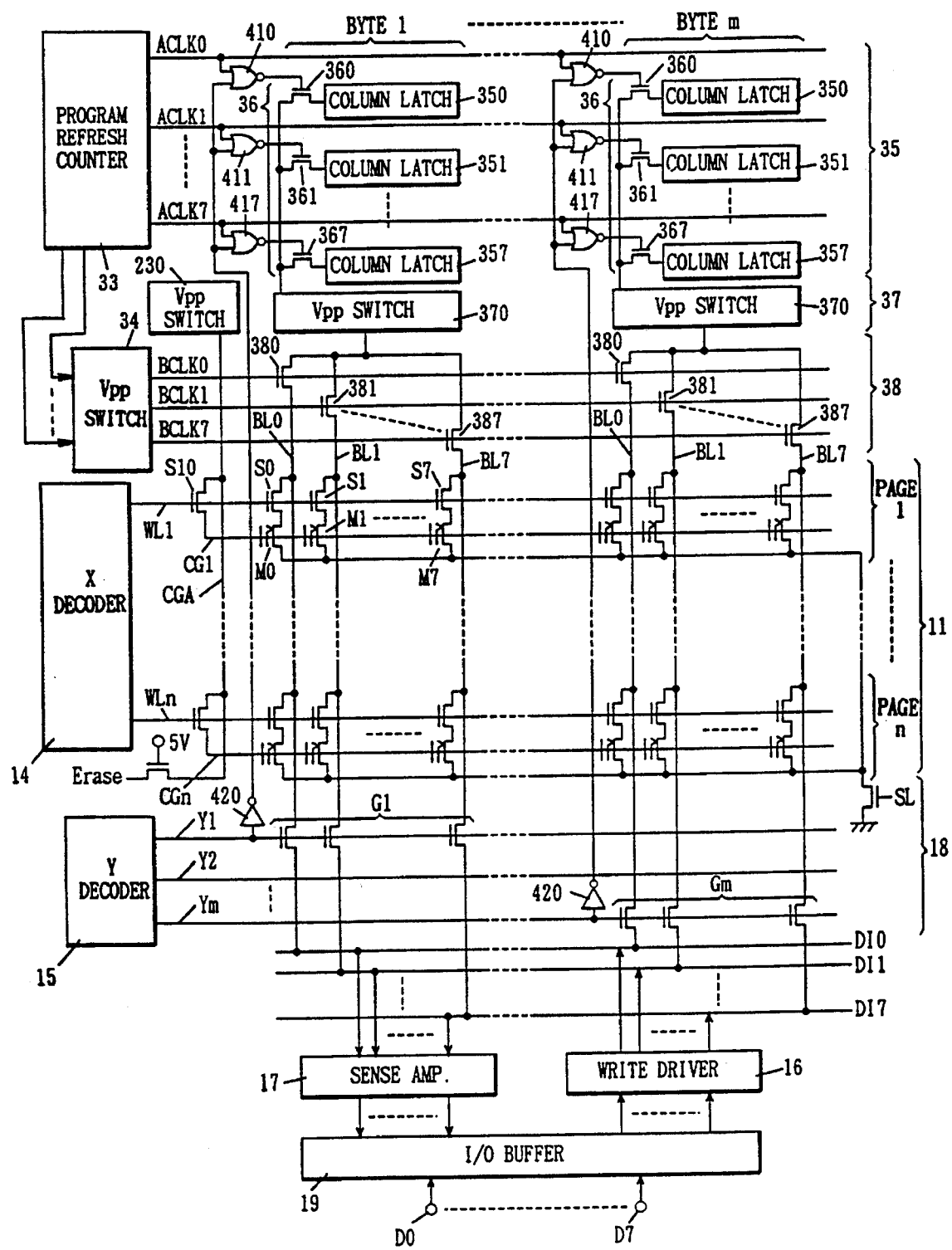
FIG. 15 shows a further example of the structure of the main portion of the EEPROM in accordance with the third embodiment.
Figure 16:
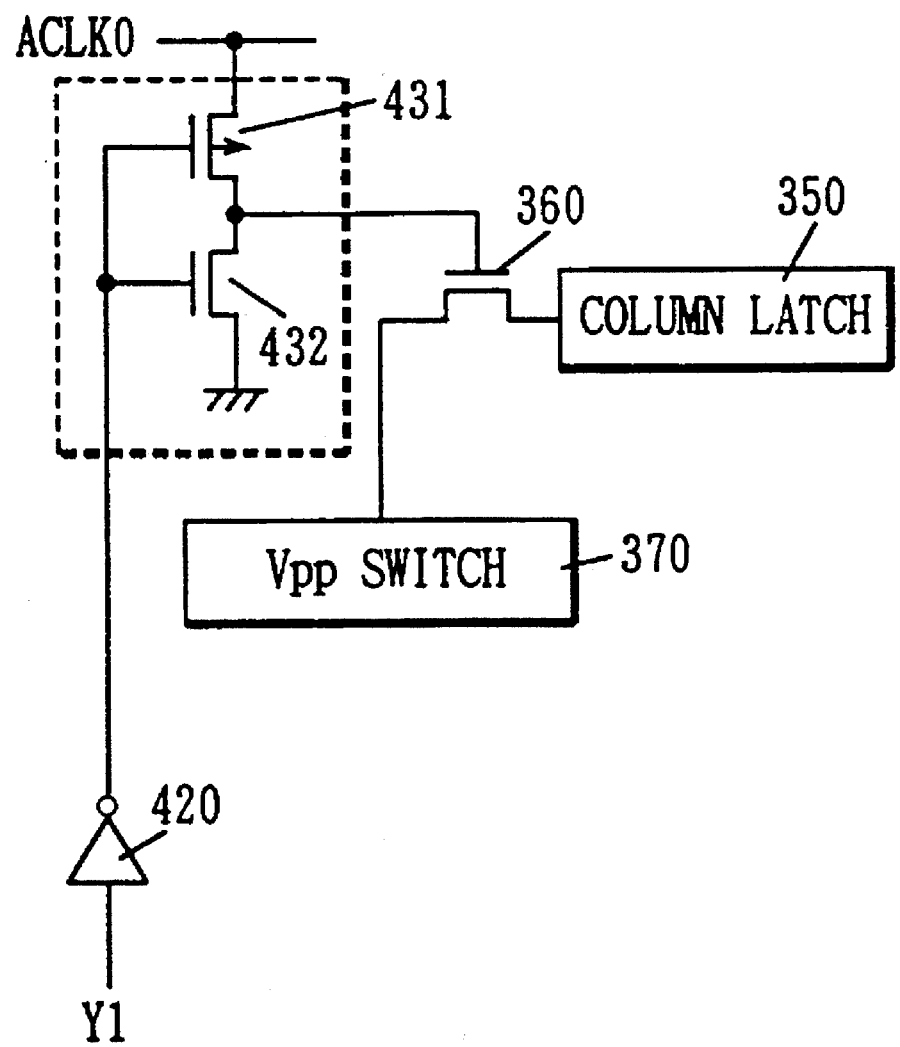
FIG. 16 shows an example of a structure used instead of an NOR gate of FIG. 15.

In the example of FIG. 15, the above mentioned function is realized by an inverter 420 and NOR gates 410 to 417. However, instead of the NOR gates, p channel type transistor 431 and an N channel type transistor 432 may be used as shown in FIG. 16. In this case, the same function can be realized by fewer number of transistors.

In the above described third embodiment, one Vpp switch 370 is provided for every 8 bit lines (1 byte).

However, the same effect can be obtained if the Vpp switch 370 is provided for a prescribed plurality of bit lines.

In accordance with the third embodiment, only one Vpp switch 370 is provided for each byte. As shown in FIG. 10, column latches 350 to 357 provided for each byte can be arranged in a direction along the bit lines BL0 to BL7. Therefore, even if the pitch of the memory cells becomes narrower, column latches can be laid out easily.

(4) Fourth Embodiment

An EEPROM in accordance with the first embodiment shown in FIG. 17 differs from the conventional EEPROM of FIG. 21 in the following points.

Vpp switch group 22 in the EEPROM of FIG. 21 is eliminated. Instead of column latch group 20 and transfer gate group 21 of the EEPROM of FIG. 21, a column latch group 35, a transfer gate group 36 and a transfer gate group 38 are provided and a program refresh counter 33, a Vpp switch 34 and a Vpp switch 39 are newly provided.

Transfer gate groups 36 and 38 transmit data held in column latch group 35 to the bit lines of memory cell array 11. Program refresh counter 33 is controlled by erasure/program timing control circuit 24d and control transfer gate groups 36 and 38 at writing. The power supply of column latch group 35 is fed from charge pump 23.

Figure 17:
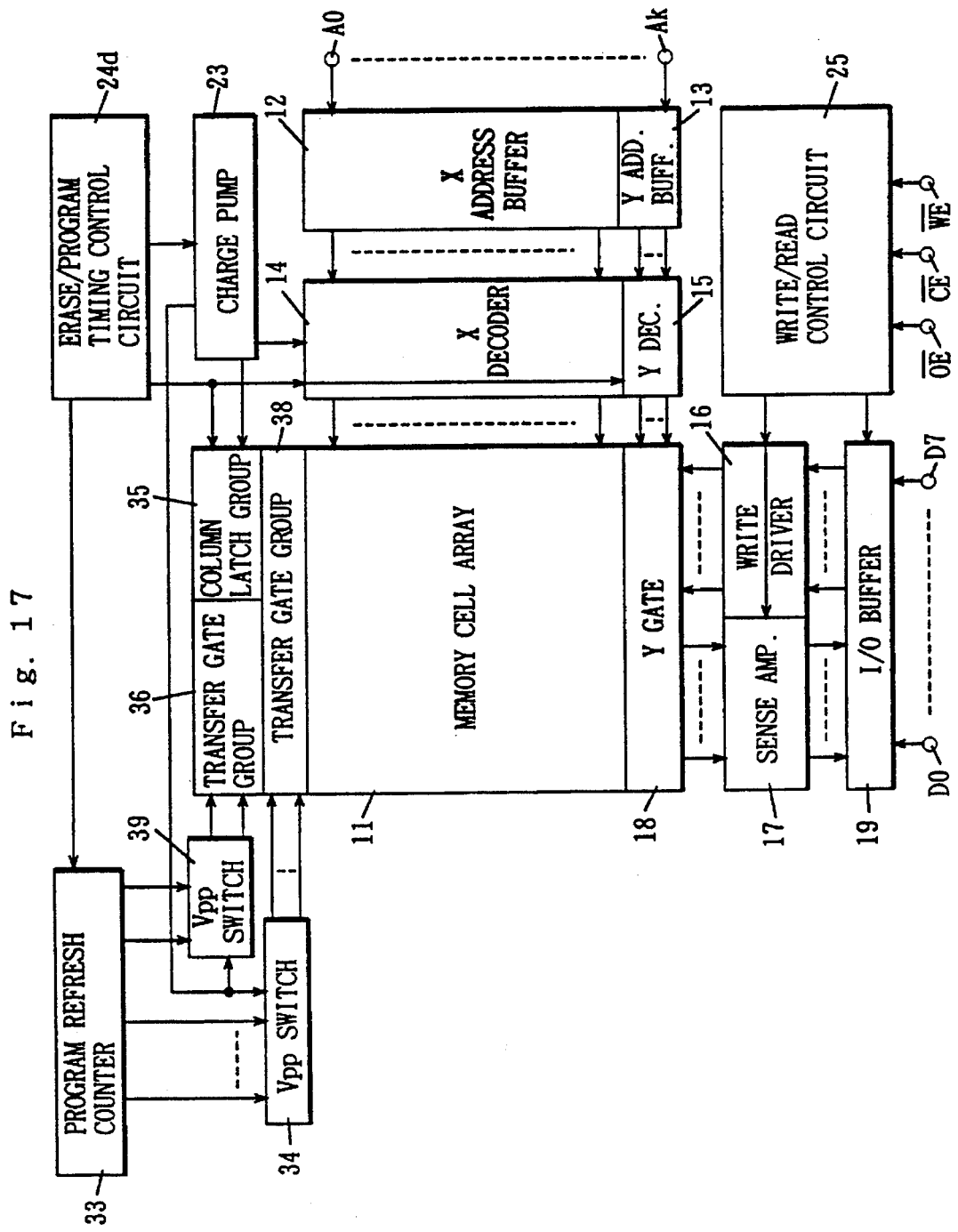
FIG. 17 is a block diagram showing a structure of an EEPROM in accordance with a fourth embodiment of the present invention.
Figure 18:
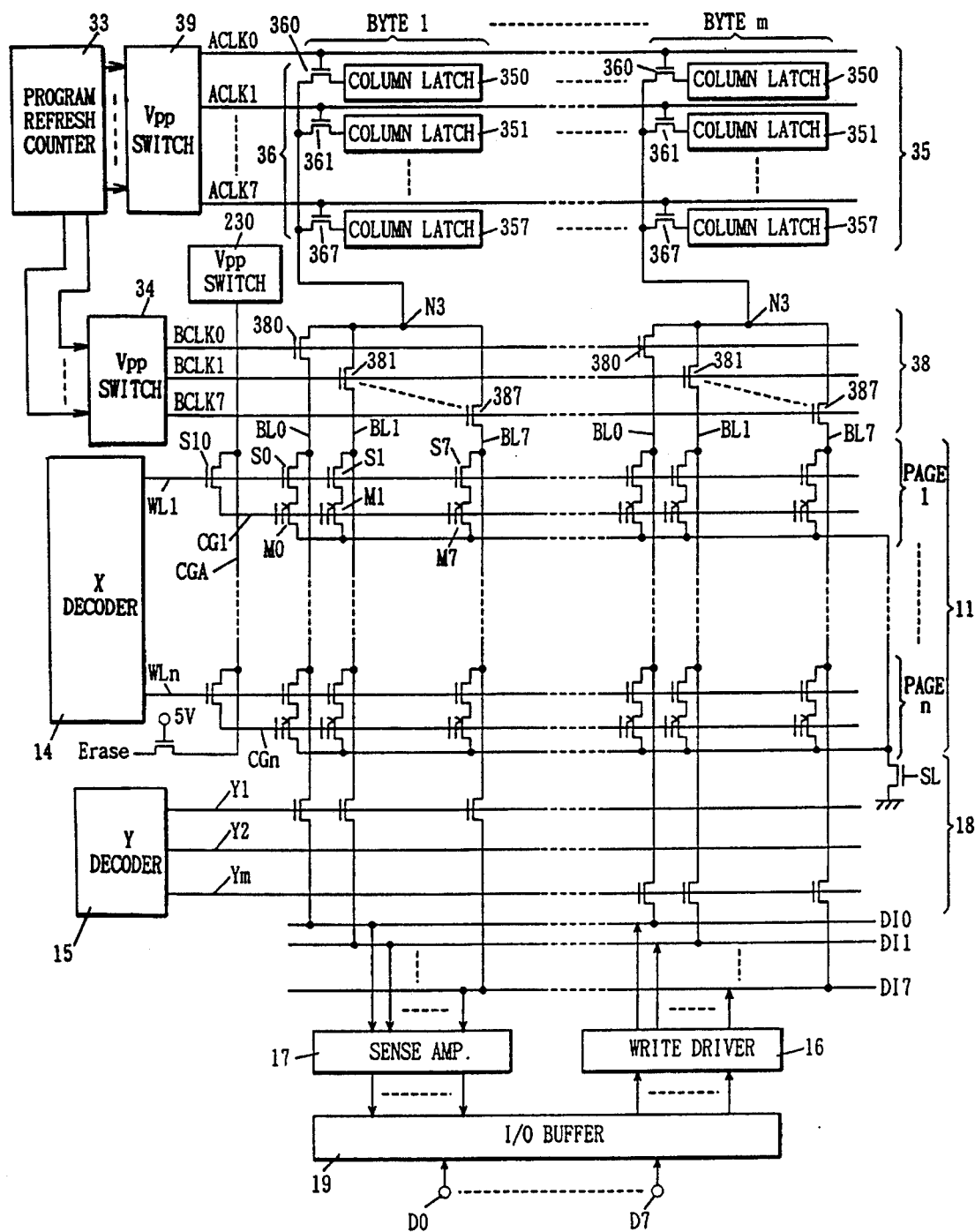
FIG. 18 shows details of the structure of the main portion of the EEPROM shown in FIG. 17.
Figure 19:
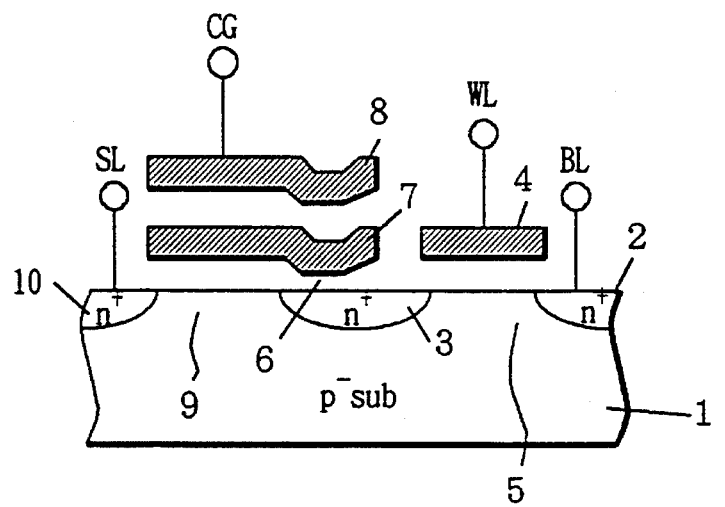
FIG. 19 is a cross sectional view of a general memory cell of an EEPROM.
Figure 20:
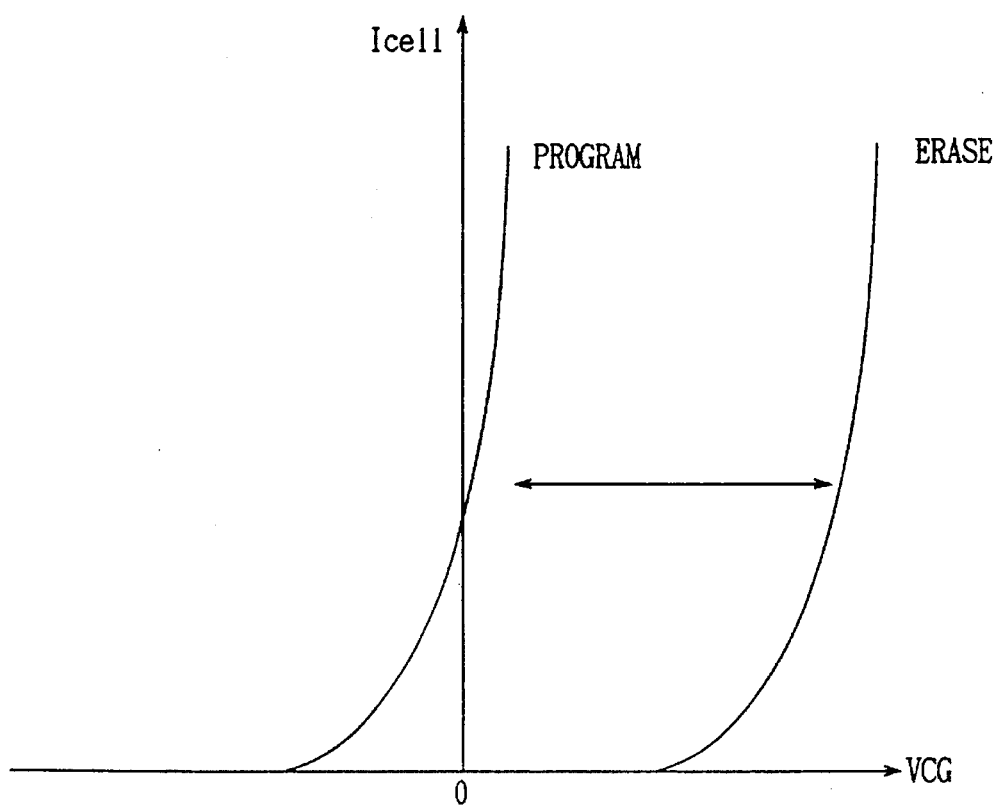
FIG. 20 shows operational characteristics of the memory cell of the EEPROM shown in FIG. 19.

FIG. 18 shows details of memory cell array 11 and the periphery thereof shown in FIG. 17.

Column latch group 35 includes a plurality of column latches 350 to 357. 8 column latches 350 to 357 are provided for each byte. Transfer gate group 36 includes a plurality of transfer gate 360 to 367. 8 transfer gates 360 to 367 are provided for each byte. Transfer gate group 38 includes a plurality of transfer gates 380 to 387. 8 transfer gates 380 to 387 are provided for each byte. Column latches 350 to 357 of each byte are connected to a node N3 through transfer gates 360 to 367, respectively. Bit lines BL0 to BL7 in each byte are connected to the corresponding node N3 through transfer gates 380 to 387, respectively.

Program refresh counter 33 applies clock signals ACLK0 to ACLK7 to transfer gates 360 to 367, respectively, through Vpp switch 39.

Program refresh counter 33 applies clock signals BCLK0 to BCLK7 to transfer gates 380 to 387, respectively, through Vpp switch 34.

A series of erasing/programming operation of the EEPROM shown in FIGS. 17 and 18 will be described in detail. It is assumed that the memory cells of page 1 of FIG. 18 are to be rewritten.

Write Cycle

First, write data input from data input/output terminals D0 to D7 are transmitted to write driver 16 through I/O buffer 19. Y gate line Y1 is selected by Y decoder 15. At this time, program refresh counter 33 operates and successively raises clock signals ACLK0 to ACLK7 and BCLK0 to BCLK7.

After a prescribed delay time from the rise of clock signal BCLK0, clock signal ACLK0 rises. Therefore, write data DI0 output from write driver 16 is written in column latch 350 of byte 1 through bit line BL0. After the end of writing to column latch 350, clock signal ACLK0 falls, and after a prescribed delay time, clock signal BCLK0 falls.

Then, clock signals BCLK1 and ACLK1 fall, and write data DI1 output from write driver 16 is written in column latch 351 of byte 1. In this manner, when writing to all the column latches 350 to 357 in byte 1 is completed, writing to column latches 350 to 357 of bytes 2 to m is carried out. At this time, charge pump 23 shown in FIG. 17 has not started its operation, and the output from column latches 350 to 357 is at the supply voltage level (generally 5 V).

Erasing Cycle

After all write data are stored in bytes 1 to m of page 1, charge pump 35 is activated, and the memory cells in page 1 are all erased in the same manner as in the conventional EEPROM.

X decoder 15 raises the voltage of word line WL1 to the high voltage Vpp. The erasing signal Erase attains "H". Thus Vpp switch 230 is activated, and the high voltage Vpp is transmitted to control gate CG1 through transistor S10. Consequently, all memory cells in page 1 are erased. When the erasing cycle ends, it enters the program cycle.

Program Cycle

Program refresh counter 33 again operates and successively raises clock signals ACLK0 to ACLK7 and BCLK0 to BCLK7.

First, clock signals ACLK0 and BCLK0 rise. Consequently, column latche 350 of each byte is simultaneously connected to the bit line BL0 of the same byte. At this time, the power supply of column latch group 35 is at the high voltage Vpp, and the clock signal BCLK0 is also at the level of the high voltage Vpp. Therefore, 0 V or the high voltage Vpp is applied to the bit line BL0 of each byte in accordance with the write data.

Since the voltage of word line WL1 has also risen to the high voltage Vpp, write voltage of 0 V or of the high voltage Vpp is applied to the tunnel region of the memory transistor M0 through the selecting transistor S0 of the memory cell connected to the bit line BL0 in each page. After a prescribed time period, clock signals ACLK0 and BCLK0 fall.

Then, clock signals ACLK1 and BCLK1 rise, and column latch 351 of each byte is connected to bit line BL1 of the corresponding byte.

In this manner, clock signals ACLK0 to ACLK7 and BCLK0 and BCLK7 rise successively. When clock signals ACLK7 and BCLK7 fall, clock signals ACLK0 and BCLK0 rise again. By repetitively carrying out the above described operation periodically, programming of the memory cells can be carried out.

As described above, it takes several ms to program the memory cells by utilizing the tunneling effect, generally. Therefore, program refresh counter 33 is rendered active for this period, and write voltage is successively applied to the memory cells.

If one selecting period (pulse width of clock signals BCLK0 to BCLK7) of each bit line is 1 µs, for example, that bit line is selected next after 7 µs. For this period, supply source of the write voltage to the memory cell is cut. However, the current consumed by the tunnelling effect is about several ten pA, and therefore, the write voltage can be sufficiently supplied by the charges in the parasitic capacitance (generally 1 to 2 pF) of the bit lines.

In the EEPROM of the fourth embodiment described above, a control gate is common to the memory cells in the same page and the memory cells of the same page are always erased at one time. However, the present invention can be applied to an EEPROM in which each of the memory cells of the same page has an independent control gate allowing independent erasing.

According to the fourth embodiment, it is not necessary to provide a Vpp switch for each byte. In addition, column latches 350 to 357 provided for each byte can be arranged in a direction along the bit lines BL0 to BL7. Therefore, even if the pitch of the memory cells becomes narrower, column latches can be laid out easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device capable of electrically programming/erasing a plurality of bytes at one time, comprising:

a plurality of bit lines;

a plurality of memory cells connected to said plurality of bit lines;

write data supplying means for supplying write data to each of said plurality of bit lines;

a plurality of write voltage establishing means each including high voltage switch means and column latch means for establishing a write voltage in accordance with the write data, each of said plurality of write voltage establishing means being commonly provided for a predetermined plurality of bit lines; and selecting means for periodically and repetitively selecting during a programming cycle each of said plurality of bit lines and for connecting the selected bit line to a corresponding one of the write voltage establishing means.

2. The non-volatile semiconductor memory device according to claim 1, wherein said selecting means includes a plurality of transfer gate means respectively connected between each of said plurality of bit lines and one of said write voltage establishing means, and counter means for periodically and repetitively selecting and turning on each of said plurality of transfer gate means at programming.

3. The non-volatile semiconductor memory device according to claim 1, wherein said write data supplying means includes input buffer means for inputting externally applied write data, data holding means for holding the write data input by said input buffer means and write voltage generating means for generating the write voltage in accordance with the write data held by said data holding means.

4. The non-volatile semiconductor memory device according to claim 1, wherein the write data includes plural bits corresponding to one byte, and said predetermined plurality of bit lines corresponds to said plural bits.

5. The non-volatile semiconductor memory device according to claim 2, wherein said counter means repetitively turns on each of said transfer gate means so that the write voltage is applied to each bit line for a sufficient time period to write data to each of the memory cells.

6. A non-volatile semiconductor memory device capable of electrically programming/erasing a plurality of bytes at one time, comprising:

a plurality of bit lines;

a plurality of memory cells connected to said plurality of bit lines;

a data latch selectively coupled to the plurality of bit lines that supplies write data to each of said plurality of bit lines;

a plurality of write voltage establishing circuits each including a high voltage switch and a column latch for establishing a write voltage in accordance with the write data, each of said plurality of write voltage establishing circuits being commonly provided for a predetermined plurality of bit lines; and a program refresh counter coupled to the plurality of write voltage establishing circuits, the program refresh counter periodically and repetitively selecting during a programming cycle each of said plurality of bit lines to thereby connect the selected bit line to a corresponding one of the write voltage establishing circuits.

7. The non-volatile semiconductor memory device according to claim 6, further comprising a plurality of transfer gates respectively connected between each of said plurality of bit lines and the corresponding one of said write voltage establishing circuits, the program refresh counter periodically and repetitively selecting and turning on during the programming cycle each of said plurality of transfer gates.

8. The non-volatile semiconductor memory device according to claim 6, further comprising an input buffer coupled to the data latch, the input buffer providing the data latch with externally applied write data, and a write driver coupled to the data latch that generates the write voltage in accordance with the write data held by the data latch.

9. The non-volatile semiconductor memory device according to claim 6, wherein said write data includes plural bits corresponding to one byte, and said predetermined plurality of bit lines corresponds to said plural bits.

10. The non-volatile semiconductor memory device according to claim 7, wherein said program refresh counter repetitively turns on each of said transfer gates so that the write voltage is applied to each bit line for a sufficient time period to write data to each of the memory cells.

11. A method of operating a non-volatile semiconductor memory device, comprising the steps of:

applying write data to each of a plurality of bit lines; and periodically and repetitively selecting during a programming cycle each of said plurality of bit lines and establishing a write voltage of the selected bit line in accordance with write data thereof.

\* \* \* \* \*